US012575431B2

(12) United States Patent
Kim et al.

(10) Patent No.: US 12,575,431 B2
(45) Date of Patent: Mar. 10, 2026

(54) POWER SEMICONDUCTOR MODULE AND POWER CONVERTER

(71) Applicant: LX SEMICON CO., LTD., Daejeon (KR)

(72) Inventors: Deog Soo Kim, Daejeon (KR); Tae Ryong Kim, Daejeon (KR); Myoung Ho Lee, Daejeon (KR); You Suk Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 19/293,852

(22) Filed: Aug. 7, 2025

(65) Prior Publication Data

US 2025/0364380 A1     Nov. 27, 2025

Related U.S. Application Data

(63) Continuation of application No. PCT/KR2025/004279, filed on Apr. 1, 2025.

(30) Foreign Application Priority Data

| | | | |
|---|---|---|---|
| Apr. 1, 2024 | (KR) | ........................ | 10-2024-0044201 |
| Apr. 3, 2024 | (KR) | ........................ | 10-2024-0045556 |

(Continued)

(51) Int. Cl.
*H01L 23/495* (2006.01)
*H01L 25/07* (2006.01)
(Continued)

(52) U.S. Cl.
CPC ...... *H01L 23/49562* (2013.01); *H01L 25/072* (2013.01); *H02M 7/003* (2013.01);
(Continued)

(58) Field of Classification Search
CPC . H01L 23/49562; H01L 25/072; H02M 7/003
(Continued)

(56) References Cited

U.S. PATENT DOCUMENTS

| | | |
|---|---|---|
| 11,621,203 B2 | 4/2023 | Estacio et al. |
| 12,080,674 B2 | 9/2024 | Oh et al. |

(Continued)

FOREIGN PATENT DOCUMENTS

| | | |
|---|---|---|
| JP | 2022-34300 A | 3/2022 |
| KR | 10-2012-0012407 A | 2/2012 |

(Continued)

*Primary Examiner* — Andargie M Aychillhum
(74) *Attorney, Agent, or Firm* — Birch, Stewart, Kolasch & Birch, LLP

(57) ABSTRACT

A power semiconductor module may comprise a common drain pad, a first power semiconductor device on a first region of the common drain pad, a second power semiconductor device on a second region of the common drain pad, a molding layer surrounding lateral parts of the first power semiconductor device and the second power semiconductor device on a peripheral region of the common drain pad, a common gate pad on the first power semiconductor device and the second power semiconductor device, and a source pad on the first power semiconductor device and the second power semiconductor device. The source pad may surround at least two outer lateral parts of the common gate pad.

18 Claims, 29 Drawing Sheets

(30)          Foreign Application Priority Data

Sep. 3, 2024   (KR) ........................ 10-2024-0119335
  Sep. 29, 2024   (KR) ........................ 10-2024-0132295
  Oct. 30, 2024   (KR) ........................ 10-2024-0151426
  Mar. 21, 2025   (KR) ........................ 10-2025-0036415

(51)  Int. Cl.
      *H02M 7/00*      (2006.01)
      *H05K 1/14*      (2006.01)
      *H05K 1/181*      (2026.01)

(52)  U.S. Cl.
      CPC ............. *H05K 1/145* (2013.01); *H05K 1/181*
                (2013.01); *H05K 2201/042* (2013.01)

(58)  Field of Classification Search
      USPC ........................................................ 361/783
      See application file for complete search history.

(56)          References Cited

U.S. PATENT DOCUMENTS

| | | |
|---|---|---|
| 2017/0089957 A1 | 3/2017 | Takada et al. |
| 2019/0198624 A1* | 6/2019 | Zhang .................... H10D 84/01 |
| 2020/0053900 A1* | 2/2020 | Feurtado .............. H05K 1/0271 |
| 2022/0238413 A1 | 7/2022 | Grassmann |
| 2023/0282561 A1 | 9/2023 | Masuda et al. |

FOREIGN PATENT DOCUMENTS

| | | |
|---|---|---|
| KR | 10-2017-0038696 A | 4/2017 |
| KR | 10-2019-0110376 A | 9/2019 |

* cited by examiner

600A

600B

POWER SEMICONDUCTOR MODULE AND POWER CONVERTER

CROSS REFERENCE TO RELATED APPLICATIONS

This application is a Continuation of PCT International Application No. PCT/KR2025/004279, filed on Apr. 1, 2025, which claims priority under 35 U.S.C. 119(a) to Patent Application Nos. 10-2024-0044201, filed in the Republic of Korea on Apr. 1, 2024; 10-2024-0045556, filed in the Republic of Korea on Apr. 3, 2024; 10-2024-0119335, filed in the Republic of Korea on Sep. 3, 2024; 10-2024-0132295, filed in the Republic of Korea on Sep. 29, 2024; 10-2024-0151426, filed in the Republic of Korea on Oct. 30, 2024; and 10-2025-0036415, filed in the Republic of Korea on Mar. 21, 2025, all of which are hereby expressly incorporated by reference into the present application.

TECHNICAL FIELD

The present disclosure relates to a power semiconductor module and a power converter.

BACKGROUND ART

Unlike a system semiconductor or a memory that process and store information or signals, a power semiconductor device is a core component that converts, stores, distributes, and controls power input to an electronic device, and is widely used in most electronic products.

Recently, in line with the global trend of strengthening environmental protection, an electric or hydrogen-based eco-friendly vehicle is widely in the spotlight instead of an existing fossil fuel-based vehicle. Numerous power semiconductor devices are used in the eco-friendly vehicle. Here, the eco-friendly vehicle includes a hybrid electric vehicle (HEV), a plug-in hybrid electric vehicle (PHEV), an electric vehicle (EV), a fuel cell electric vehicle (PCEV), etc.

Although a Si power semiconductor device has been widely used in the conventional art, there is a strong demand for the development of a new power semiconductor device due to low power, low insulation breakdown characteristics, low thermal conductivity, etc.

Accordingly, research is actively being conducted on a power semiconductor device based on a semiconductor compound such as SiC, GaN, and $Ga_2O_3$, which has an energy band gap that is about three times greater than that of the conventional Si power semiconductor device. The power semiconductor device based on the semiconductor compound has high power, high dielectric breakdown characteristics, high thermal conductivity, etc.

Meanwhile, as illustrated in FIGS. 1A and 1B, an inverter includes power semiconductor devices 30 and 40 based on semiconductor compounds. A plurality of power semiconductor devices 30 and 40 are mounted between a first substrate 10 and a second substrate 20 using a flip-chip bonding method. The power semiconductor devices 30 and 40 each have gate electrodes 30a and 40a and source electrodes 30b and 40b positioned on the same surface. In this instance, the gate electrode 30a and the source electrode 30b of each of some power semiconductor devices 30 are electrically connected to the second substrate 20 toward the top, and the gate electrode 40a and the source electrode 40b of each of other power semiconductor devices 40 are electrically connected to the first substrate 10 toward the bottom.

The inverter has a terminal (or lead frame) 50 disposed between the first substrate 10 and the second substrate 20. Since the thickness of the terminal 50 is greater than the thickness of each of the power semiconductor devices 30 and 40, the upper or lower parts of each of the power semiconductor devices 30 and 40 are spaced from the first substrate 10 or the second substrate 20. To compensate for this spacing, spacers 70 and 80 are disposed on the upper and lower parts of the power semiconductor devices 30 and 40.

Meanwhile, as each of the power semiconductor devices 30 and 40 are increasingly required to have higher performance, the size of the die is reduced. In addition, the size of each gate electrode 30a and 40a is reduced in order to maximize the active area of each power semiconductor device 30 and 40.

Accordingly, when the power semiconductor devices 30 and 40 are bonded to the first substrate 10 or the second substrate 20, the bonding process risk is high. For example, defects such as gate open or gate-source short occur due to misalignment such as die shift. Since the size of the gate electrodes 30a and 40a is reduced, detachment of the power semiconductor devices 30 and 40 occurs due to insufficient bonding strength, which reduces reliability.

When the power semiconductor devices 30 and 40 and the spacers 70 and 80 are connected and not insulated, sparks and other flames fly due to insulation problems during a high voltage (>1,200 V) test, making full testing impossible. When an inverter is implemented using numerous power semiconductor devices 30 and 40 that have not been fully tested, in case that one of the power semiconductor devices 30 and 40 is defective, the inverter must be discarded. Therefore, the development of technology that enables a full test is urgent.

When the power semiconductor devices 30 and 40 connected with the spacers 70 and 80 are mounted between the first substrate 10 and the second substrate 20 and EMC-filled, there is a problem that an electrical short-circuit occurs between the source electrodes 30b and 40b and the gate electrodes 30a and 40a of the power semiconductor devices 30 and 40.

It is difficult to secure the yield because it is vulnerable to surface foreign matter or EMC filling defects. The weak bonding due to the small size of the gate electrodes 30a and 40a is difficult to select through electrical evaluation, and it is difficult to completely select it even through bonding surface inspection, so that the possibility of defective products is very high. When evaluating reliability at the development stage, delamination of the gate electrodes 30a and 40a occurs, and when continuous thermal stress is applied, the possibility of field defects is also very high.

DISCLOSURE

Technical Problem

Accordingly, the present disclosure is to solve the above-mentioned problem and other problems.

The present disclosure is to provide a power semiconductor module and a power converter capable of increasing the yield.

The present disclosure is to provide a power semiconductor module and a power converter capable of preventing bonding defects.

The present disclosure is to provide a power semiconductor module and a power converter capable of securing reliability.

The present disclosure is to provide a power semiconductor module and a power converter capable of preventing an electrical short-circuit.

The present disclosure is to provide a power semiconductor module and a power converter capable of high-voltage testing during a manufacturing process.

The present disclosure is not limited to those described, and comprises those that may be understood through the description of the disclosure.

Technical Solution

According to one aspect of the aspects to achieve the above or other objects, a power semiconductor module, comprising: a common drain pad; a first power semiconductor device on a first region of the common drain pad; a second power semiconductor device on a second region of the common drain pad; a common gate pad on the first power semiconductor device and the second power semiconductor device; and a source pad on the first power semiconductor device and the second power semiconductor device, wherein the common drain pad is configured to be electrically connected to a first drain electrode of the first power semiconductor device and a second drain electrode of the second power semiconductor device, wherein the common gate pad is configured to be electrically connected to a first gate electrode of the first power semiconductor device and a second gate electrode of the second power semiconductor device, wherein the source pad is configured to be electrically connected to a first source electrode of the first power semiconductor device and a second source electrode of the second power semiconductor device, and wherein the source pad is configured to surround at least two outer lateral parts of the common gate pad.

The source pad may comprise a common source pad that vertically overlaps the first power semiconductor device and the second power semiconductor device.

The common source pad may have an opening, and the common gate pad is positioned in the opening.

The common gate pad may comprise a first short-lateral part and a second short-lateral part in one direction, and a first long-lateral part and a second long-lateral part in a direction perpendicular to the one direction.

The common source pad may be positioned on the first short-lateral part, the second short-lateral part, and the first long-lateral part of the common gate pad.

The common source pad may be positioned on the second long-lateral part of the common gate pad.

The first short-lateral part of the common gate pad may be positioned between the first gate electrode and the first source electrode, and the second short-lateral part of the common gate pad may be positioned between the second gate electrode and the second source electrode.

The source pad may comprise a first source pad and a second source pad that vertically overlap the first source electrode of the first power semiconductor device and the second source electrode of the second power semiconductor device, respectively.

The power semiconductor module may further comprise a Kelvin source pad spaced apart from the source pad on the first power semiconductor device and the second power semiconductor device.

A size of the common gate pad may be greater than a size of the first gate electrode of the first power semiconductor device or a size of the second gate electrode of the second power semiconductor device.

According to another aspect of the aspects, a power semiconductor module, comprising: a common drain pad; a first power semiconductor device on a first region of the common drain pad; a second power semiconductor device on a second region of the common drain pad; a common gate pad on the first power semiconductor device and the second power semiconductor device; and a source pad on the first power semiconductor device and the second power semiconductor device, wherein the common drain pad is configured to be electrically connected to a first drain electrode of the first power semiconductor device and a second drain electrode of the second power semiconductor device, wherein the common gate pad is configured to be electrically connected to a first gate electrode of the first power semiconductor device and a second gate electrode of the second power semiconductor device, wherein the source pad is configured to be electrically connected to a first source electrode of the first power semiconductor device and a second source electrode of the second power semiconductor device, and wherein the common gate pad vertically overlaps at least one of the first source electrode and the second source electrode.

The common gate pad may be disposed across the first source electrode and the first gate electrode and the second gate electrode and the second source electrode along one direction on the first region of the common drain pad.

The source pad may comprise a common source pad that vertically overlaps the first power semiconductor device and the second power semiconductor device.

The common source pad may be disposed across the first source electrode and the second source electrode along the one direction on the second region of the common drain pad.

An area of the common source pad may be greater than an area of the first source electrode of the first power semiconductor device or an area of the second source electrode of the second power semiconductor device.

An area of the common drain pad may be greater than a sum of an area of the common gate pad and an area of the common source pad.

The source pad may comprise a first source pad and a second source pad that vertically overlap the first source electrode of the first power semiconductor device and the second source electrode of the second power semiconductor device, respectively.

The power semiconductor module may further comprise a Kelvin source pad spaced from the source pad on the first power semiconductor device and the second power semiconductor device.

According to another aspect of the aspects, a power converter, comprising: a first substrate; a second substrate; and a plurality of power semiconductor modules between the first substrate and the second substrate, wherein the plurality of power semiconductor modules each comprise: a common drain pad; a first power semiconductor device on a first region of the common drain pad; a second power semiconductor device on a second region of the common drain pad; a common gate pad on the first power semiconductor device and the second power semiconductor device; and a common source pad on the first power semiconductor device and the second power semiconductor device, wherein the common source pad is configured to surround at least two lateral parts of the common gate pad, wherein in some modules of the plurality of power semiconductor modules, the common drain pad is configured to be electrically connected to the first substrate, the common gate pad and the common source pad are each electrically connected to the second substrate, and wherein in the remaining modules of the plurality of power semiconductor modules, the common drain pad is configured to be electrically connected to the second substrate, and the common gate pad and the common source pad are each electrically connected to the first substrate.

The power converter may further comprise a plurality of terminals connected to each of the first substrate and the second substrate.

Advantageous Effects

The effects of the power semiconductor module and the power converter according to the present disclosure are described as follows.

According to at least one of the aspects, by packaging a plurality of power semiconductor devices, the common gate pad connecting the gate electrodes of the plurality of power semiconductor devices may be expanded as much as possible, thereby preventing bonding defects or detachment defects and increasing the yield. In addition, since the common gate pad and the common source pad may be expanded, the separation distance between the power semiconductor devices may be further increased and a molding layer may be filled between the power semiconductor devices. Accordingly, not only are the power semiconductor devices hardly affected by each other's thermal characteristics, but also the heat dissipation characteristics generated from each power semiconductor device can be improved.

According to at least one of the aspects, by packaging a plurality of power semiconductor devices, the power semiconductor devices having very thin thicknesses are not exposed to the outside, so that electrical short-circuits due to foreign substances or dust can be prevented, thereby increasing the yield.

According to at least one of the aspects, when packaging a plurality of power semiconductor devices, since the plurality of power semiconductor devices are surrounded by a molding layer, the presence or absence of defects may be detected through a high-voltage test of 1,200 V or more before being mounted in a power converter. Therefore, there is an advantage in that a power semiconductor module with a defect is discarded in advance through a full test, so that potential risks such as breakdown due to overvoltage or rating-related failure of each power semiconductor device are fundamentally blocked, thereby improving product reliability.

According to at least one of the aspects, since the common drain pad is expanded to a size that covers all of the plurality of power semiconductor devices and has excellent thermal characteristics, there is an advantage in that excellent electrode characteristics as well as excellent heat dissipation characteristics can be obtained.

According to at least one of the aspects, since a power semiconductor module comprising the number of power semiconductor devices desired by a customer may be more easily obtained through packaging a plurality of power semiconductor devices, there is an advantage in that the degree of freedom in manufacturing the power semiconductor module can be maximized.

According to at least one of the aspects, each power semiconductor module may be manufactured to be the same as the largest thickness among the thicknesses of the terminals. Therefore, when each power semiconductor module and the terminals are mounted between the first substrate and the second substrate, since each power semiconductor module is in surface contact with the first substrate and the second substrate, a separate member such as a spacer is not required, so that a bonding defect between each power semiconductor module and the spacer can be prevented, and the assembly process of the power converter can be facilitated.

Figure 1A:
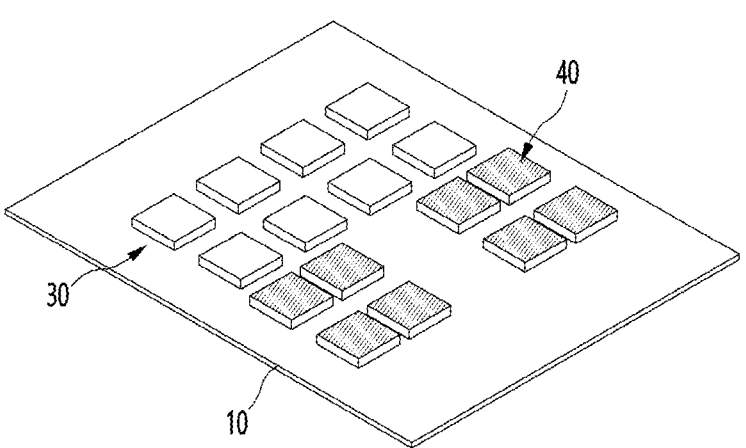
FIG. 1A is a drawing illustrating a plurality of power semiconductor devices mounted on a first substrate.

The sizes, shapes, and values, etc., of the components illustrated in the drawings may differ from the actual ones. In addition, even if the same components are illustrated with different sizes, shapes, and values between the drawings, this is only one example in the drawings, and the same components may have the same sizes, shapes, values, etc., between the drawings.

MODE FOR INVENTION

Hereinafter, the aspects disclosed in this specification will be described in detail with reference to the attached drawings. Regardless of the drawing symbols, identical or similar components will be given the same reference numbers and redundant descriptions thereof will be omitted. The suffixes 'module' and 'part' used for components in the following description are given or used interchangeably in consideration of the ease of writing the specification, and do not have distinct meanings or roles in themselves. In addition, the attached drawings are intended to facilitate easy understanding of the aspects disclosed in this specification, and the technical ideas disclosed in this specification are not limited by the attached drawings. In addition, when an element such as a layer, region, or substrate is mentioned as existing 'on' another element, this comprises that it may be directly on the other element or that other intermediate elements may exist between them.

Figure 2:
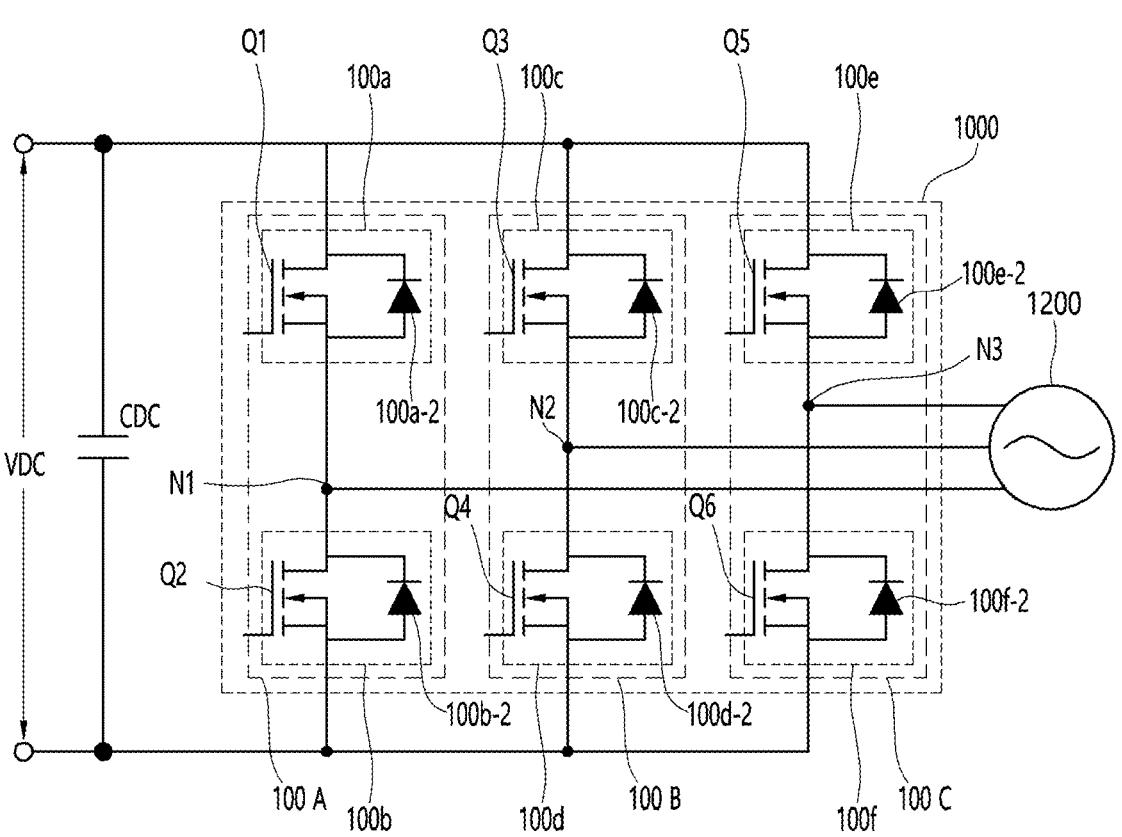
FIG. 2 is a circuit diagram illustrating an inverter according to an aspect of the present disclosure.

FIG. 2 is a circuit diagram illustrating an inverter according to an aspect of the present disclosure.

Referring to FIG. 2, an inverter 1000 according to the present disclosure may be applied to applications such as a three-phase motor or a compressor. The inverter 1000 may output three-phase power. The inverter 1000 may be a power converter or may be included in a power converter. The inverter 1000 may comprise a switching circuit. The power converter may also be referred to as a power semiconductor module.

The inverter 1000 according to the present disclosure may convert DC power into AC power and supply the converted AC power to a load 1200 to drive the load 1200. In the inverter 1000 according to the present disclosure, a converter may be connected to an input side so that AC power may be converted into DC power. In this instance, the DC power converted by the converter may be used to drive the load 1200 after being converted into AC power by the inverter 1000. The load 1200 may be a motor or an electric motor, but is not limited thereto.

The inverter 1000 according to the present disclosure may comprise a three-phase inverter, but is not limited thereto. At this time, a phase difference of 120 degrees may be present between a first phase, a second phase, and a third phase. The inverter 1000 according to the present disclosure may comprise a plurality of legs 100A, 100B, and 100C. For example, the first leg 100A, the second leg 100B, and the third leg 100C may be connected in parallel to the load 1200, i.e., the motor, through a first node N1, a second node N2, and a third node N3, respectively. The first leg 100A may comprise a first arm 100*a* and a second arm 100*b* connected in series with each other, the second leg 100B may comprise a third arm 100*c* and a fourth arm 100*d* connected in series with each other, and the third leg 100C may comprise a fifth arm 100*e* and a sixth arm 100*f* connected in series with each other. Here, the first arm 100*a*, the third arm 100*c*, and the fifth arm 100*e* may be referred to as upper arms, and the second arm 100*b*, the fourth arm 100*d*, and the sixth arm 100*f* may be referred to as lower arms. Each of the first arm 100*a* to the sixth arm 100*f* may be referred to as a switching module, a submodule, etc.

The first arm 100*a* to the sixth arm 100*f* may comprise switching elements Q1 to Q6 and diodes 100*a*-2 to 100*f*-2, respectively. The switching elements Q1 to Q6 and the diodes 100*a*-2 to 100*f*-2 may be formed simultaneously using the same semiconductor process. The switching elements Q1 to Q6 may comprise power semiconductor devices.

In order for the DC power to be converted into AC power by the inverter 1000 according to the present disclosure, the switching elements Q1 to Q6 of the first arm 100*a* to the sixth arm 100*f* may be controlled to be turned on/off.

For example, when the first switching element Q1 of the first arm 100*a* of the first leg 100A is turned on, the fourth switching element Q4 of the fourth arm 100*d* of the second leg 100B and/or the sixth switching element Q6 of the sixth arm 100*f* of the third leg 100C may be turned on. Accordingly, DC power may be supplied to the first phase inductor of the motor.

For example, when the third switching element Q3 of the third arm 100*c* of the second leg 100B is turned on, the sixth switching element Q6 of the sixth arm 100*f* of the third leg 100C and/or the second switching element Q2 of the second arm 100*b* of the first leg 100A may be turned on. Accordingly, DC power may be supplied to the second phase inductor of the motor. The second phase may be 120 degrees out of phase with respect to the first phase.

For example, when the fifth switching element Q5 of the fifth arm 100*e* of the third leg 100C is turned on, the second switching element Q2 of the second arm 100*b* of the first leg 100A and/or the fourth switching element Q4 of the fourth arm 100*d* of the second leg 100B may be turned on. Accordingly, DC power may be supplied to the third phase inductor of the motor. The third phase may be 120 degrees out of phase with respect to the second phase.

Accordingly, AC power may be generated by the DC power supplied to each of the first phase inductor, the second phase inductor, and the third inductor.

Meanwhile, although not illustrated, in order to increase the voltage-withstand capability, the switching elements of the first arm 100*a* to the sixth arm 100*f*, i.e., the power semiconductor devices Q1 to Q6, may be provided in multiple units connected in series with each other.

Although not illustrated, in order to increase the current characteristics, the switching elements of the first arm 100*a* to the sixth arm 100*f*, i.e., the power semiconductor devices Q1 to Q6, may be provided in multiple units connected in parallel with each other.

Meanwhile, the switching elements Q1 to Q6 and the diodes 100*a*-2 to 100*f*-2 constituting the first arm 100*a* to the sixth arm 100*f* may be packaged to form a power semiconductor module.

As an example, the first leg 100A, the second leg 100B, and the third leg 100C may be each configured as a power semiconductor module. That is, the first arm 100a and the second arm 100b of the first leg 100A may be packaged to form a first power semiconductor module. The third arm 100c and the fourth arm 100d of the second leg 100B may be packaged to form a second power semiconductor module. The fifth arm 100e and the sixth arm 100f of the third leg 100C may be packaged to form a third power semiconductor module.

As another example, the first leg 100A, the second leg 100B, and the third leg 100C may be configured as a single power semiconductor module. That is, the first arm 100a and the second arm 100b of the first leg 100A, the third arm 100c and the fourth arm 100d of the second leg 100B, and the fifth arm 100e and the sixth arm 100f of the third leg 100C may be packaged to form a single power semiconductor module.

The unexplained symbol VDC is an input-side voltage, which may be, for example, a DC voltage. The unexplained symbol CDC is a capacitor that may charge the input-side voltage VDC.

Meanwhile, a power semiconductor device is usually named a die when it is being manufactured on a wafer, and may be named a chip after it is separated by cutting the wafer. Hereinafter, a die or chip will be collectively referred to as a power semiconductor device.

Figure 3:
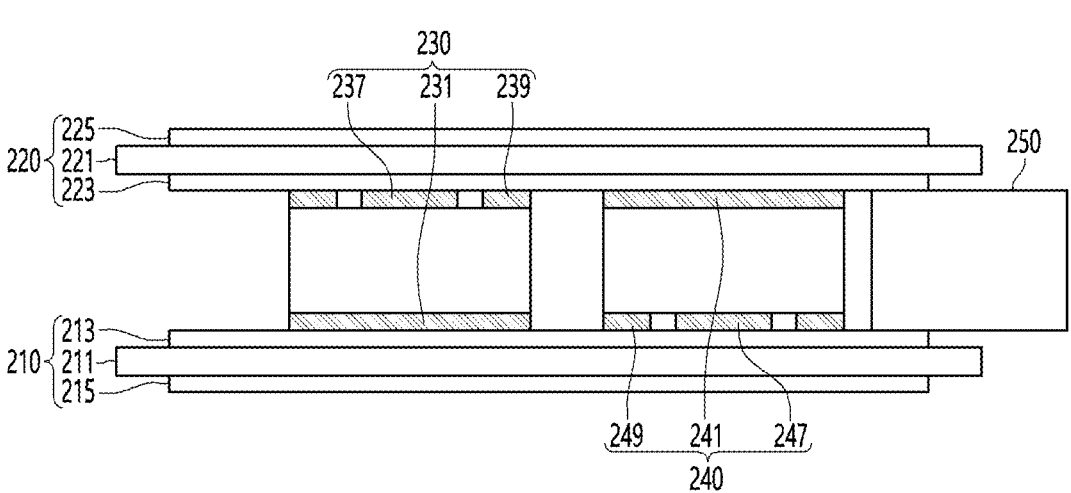
FIG. 3 is a cross-sectional view illustrating a power converter according to an aspect of the present disclosure.
Figure 4:
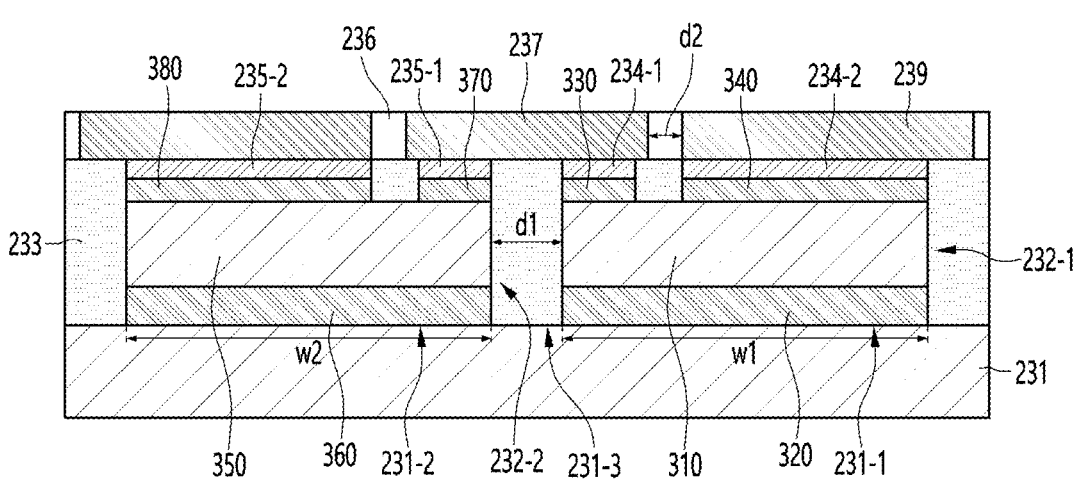
FIG. 4 is a cross-sectional view illustrating a power semiconductor module according to a first aspect of the present disclosure.

FIG. 3 is a cross-sectional view illustrating a power converter according to an aspect of the present disclosure. FIG. 4 is a cross-sectional view illustrating a power semiconductor module according to a first aspect of the present disclosure.

Although the first power semiconductor module 230 is illustrated in FIG. 4 among the plurality of power semiconductor modules (230, 240, 260, and 270 of FIG. 8), the structure of each of the second power semiconductor module 240, the third power semiconductor module 260, and the fourth power semiconductor module 270 may be identical to the structure of the first power semiconductor module 230 illustrated in FIG. 4. Therefore, the structure of each of the second power semiconductor module 240, the third power semiconductor module 260, and the fourth power semiconductor module 270 may be easily understood from the structure of the first power semiconductor module 230 illustrated in FIG. 4.

Referring to FIG. 3, the power converter 200 according to the present disclosure may comprise a first substrate 210, a second substrate 220, a first power semiconductor module 230, a second power semiconductor module 240, terminals 250, etc.

The first substrate 210 and the second substrate 220 may comprise insulating layers 211 and 221, first metal layers 213 and 223, second metal layers 215 and 225, etc., respectively. The insulating layer 211 and 221 may be made of an inorganic material, a ceramic material, an alumina material, a plastic material, a glass material, etc.

The first metal layer 213 and 223 may comprise a plurality of circuit patterns (not illustrated). The plurality of circuit patterns may be electrically connected to the first power semiconductor module 230 and the second power semiconductor module 240. Therefore, the first metal layer 213 and 223 may be formed of a metal material having excellent electrical conductivity. For example, the first metal layer 213 and 223 may have a single-layer structure or a multi-layer structure made of copper (Cu), gold (Au), aluminum (Al), platinum (Pt), etc.

The first metal layer 213 and 223 may be formed of a material having excellent electrical conductivity as well as heat dissipation performance.

The circuit pattern may be named a heat dissipation pattern. In this instance, the first metal layer 213 and 223 may comprise a plurality of heat dissipation patterns. The plurality of heat dissipation patterns may be electrically connected to the first power semiconductor module 230 and the second power semiconductor module 240.

The second metal layer 215 and 225 may serve to quickly release heat generated from the first power semiconductor module 230 and the second power semiconductor module 240 to the outside. Therefore, the second metal layer 215 and 225 may be formed of a material having excellent heat dissipation characteristics. For example, the second metal layer 215 and 225 may be aluminum (Al) or an aluminum alloy, but are not limited thereto. The second metal layers 215 and 225 may be referred to as heat sinks or heat sinks.

The first power semiconductor module 230 and the second power semiconductor module 240 may be mounted between the first substrate 210 and the second substrate 220.

In the present disclosure, the first power semiconductor module 230 and the second power semiconductor module 240 may each comprise at least two or more power semiconductor devices. The two or more power semiconductor devices may be connected in parallel with each other.

Although the first power semiconductor module 230 and the second power semiconductor module 240 are illustrated in FIG. 3, four power semiconductor modules (230, 240, 260, and 270 of FIG. 8) or more power semiconductor modules may be provided. In this instance, the first power semiconductor module 230 and the third power semiconductor module 260 may be connected in parallel with each other, and the second power semiconductor module 240 and the fourth power semiconductor module 270 may be connected in parallel with each other. The first power semiconductor module 230 may be connected in series with the second power semiconductor module 240 or the fourth power semiconductor module 270. The third power semiconductor module 270 may be connected in series with the second power semiconductor module 240 or the fourth power semiconductor module 270.

Figure 1B:
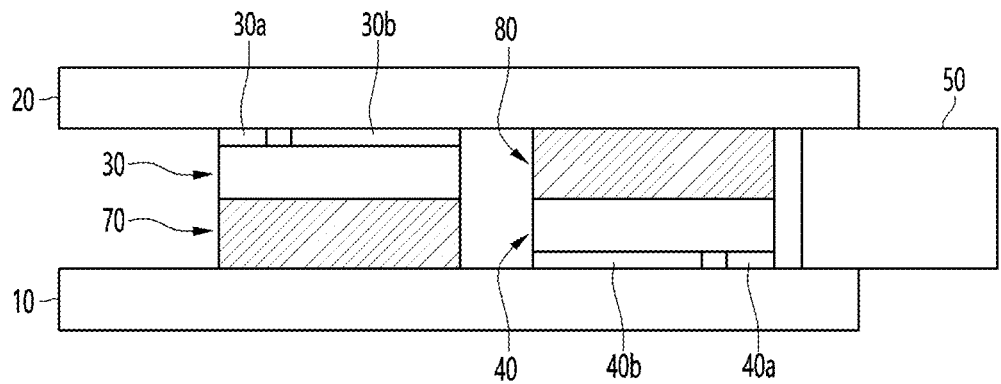
FIG. 1B is a drawing illustrating a second substrate bonded to the first substrate illustrated in FIG. 1A.
Figure 8:
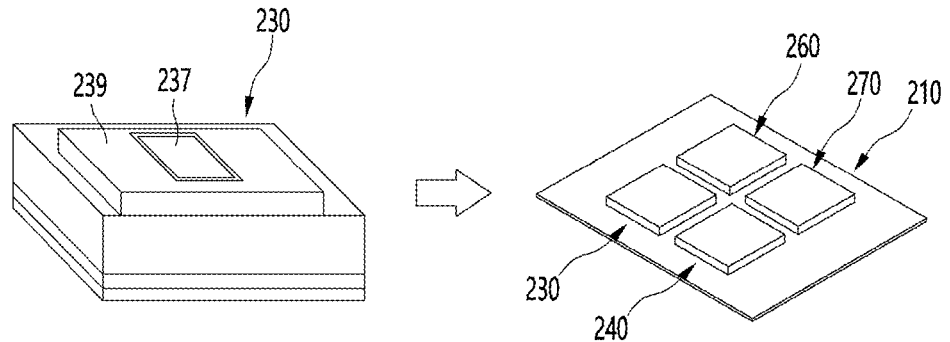
FIG. 8 is a drawing illustrating a plurality of power semiconductor modules mounted on a first substrate.

In FIG. 8, the first leg 100A illustrated in FIG. 1 may be configured by power semiconductor modules 230, 240, 260, and 270, for example. In this instance, the first arm 100a of the first leg 100A may be configured by the first power semiconductor module 230 and the third power semiconductor module 260 of FIG. 8, and the second arm 100b of the first leg 100A may be configured by the second power semiconductor module 240 and the fourth power semiconductor module 270. The first switching element Q1 of the first arm 100a may be configured by a plurality of power semiconductor devices of each of the first power semiconductor module 230 and the third power semiconductor module 260. The second switching element Q2 of the second arm 100b may be formed by a plurality of power semiconductor devices of each of the second power semiconductor module 240 and the fourth power semiconductor module 270. The second leg 100B and the third leg 100C illustrated in FIG. 1 may also be formed by power semiconductor modules 230, 240, 260 and 270 in FIG. 8.

Meanwhile, the terminals 250 (or lead frames) may serve to connect the external circuits (or drivers) and the first power semiconductor module 230 and the second power semiconductor module 240.

For example, at least five terminals may be provided, but is not limited thereto. For example, a first terminal and a second terminal may be electrically connected to the first power semiconductor module 230 through corresponding circuit patterns of the first substrate 210. For example, a third terminal may be commonly connected to the first power semiconductor module 230 and the second power semiconductor module 240 through corresponding circuit patterns of the first substrate 210 or the second substrate 220. Alternatively, the third terminal may be provided integrally formed with two sub-terminals. In this instance, the two sub-terminals may be electrically connected to the first power semiconductor module 230 and the second power semiconductor module 240, respectively.

For example, a fourth terminal and a fifth terminal may be electrically connected to the second power semiconductor module 240 through corresponding circuit patterns of the second substrate 220. In this instance, the first terminal and the fourth terminal may provide a switching signal, a gate signal, a control signal, etc., that control the on/off of the first power semiconductor module 230 and the second power semiconductor module 240, respectively.

The thickness of each of the first power semiconductor module 230 and the second power semiconductor module 240 may be the same as the largest thickness among the thicknesses of each of the terminals 250. The thickness of each of the terminals 250 may be determined in consideration of the power, voltage, current, etc., supplied to the first power semiconductor module 230 or the second power semiconductor module 240. Accordingly, the first power semiconductor module 230 and the second power semiconductor module 240 may be in direct contact with the first substrate 210 and the second substrate 220, respectively. In this instance, a separate member such as a spacer for filling the gap between the first power semiconductor module 230 (or the second power semiconductor module 240) and the first substrate 210 or between the first power semiconductor module 230 (or the second power semiconductor module 240) and the second substrate 220 is not required, so that a bonding defect between the first power semiconductor module 230 (or the second power semiconductor module 240) and the spacer can be prevented, and the assembly process of the power converter can be facilitated.

Referring to FIG. 3, the first power semiconductor module 230 and the second power semiconductor module 240 may comprise common drain pads 231 and 241, common gate pads 237 and 247, common source pads 239 and 249, etc.

As illustrated in FIG. 4, the first power semiconductor module 230 may comprise a first power semiconductor device 232-1, a second power semiconductor device 232-2, a molding layer 233, etc. Although not illustrated, the second power semiconductor module 240 may also comprise a first power semiconductor device, a second power semiconductor device, a molding layer, etc. In the second power semiconductor module 240, the first power semiconductor device, the second power semiconductor device, and the molding layer, which are not illustrated, may have the same structure, shape, and/or function as the first power semiconductor device 232-1, the second power semiconductor device 232-2, and the molding layer 233 of the first power semiconductor module 230, respectively.

The common drain pad 231 may serve to support the first power semiconductor device 232-1, the second power semiconductor device 232-2, the molding layer 233, the common gate pad 237, and the common source pad 239. The common drain pad 231 may serve as a common electrode that commonly connects the first drain electrode 320 of the first power semiconductor device 232-1 and the second drain electrode 360 of the second power semiconductor device

232-2. The common drain pad 231 may serve as an electrode pad that electrically connects each of the first power semiconductor device 232-1 and the second power semiconductor device 232-2 to the first substrate 210 or the second substrate 220. Therefore, the common drain pad 231 may be formed of a metal material having excellent electrical conductivity. For example, the common drain pad 231 may comprise copper (Cu). For example, the common drain pad 231 may have a three-layer structure of copper (Cu)-molybdenum (Mo)-copper (Cu). The common drain pad 231 may be named a conductive layer, a metal layer, a support layer, a conductive support layer, a support member, a heat dissipation member, etc.

The common drain pad 231 may comprise a first region 231-1, a second region 231-2, and a remaining region 231-3. The first region 231-1 and the second region 231-2 may be positioned spaced apart from each other, and the remaining region 231-3 may be a region excluding the first region 231-1 and the second region 231-2, i.e., a peripheral region.

The first power semiconductor device 232-1 and the second power semiconductor device 232-2 may be disposed on the common drain pad 231. The first power semiconductor device 232-1 may be disposed on the first region 231-1 of the common drain pad 231, and the second power semiconductor device 232-2 may be disposed on the second region 231-2 of the common drain pad 231. The first region 231-1 may have a size corresponding to the size of the first power semiconductor device 232-1, and the second region 231-2 may have a size corresponding to the size of the second power semiconductor device 232-2. Since the first region 231-1 and the second region 231-2 are positioned spaced apart from each other, the first power semiconductor device 232-1 and the second power semiconductor device 232-2 may also be positioned spaced apart from each other.

Although the first power semiconductor device 232-1 and the second power semiconductor device 232-2 are illustrated in the drawing, more power semiconductor devices may be provided.

Figure 5:
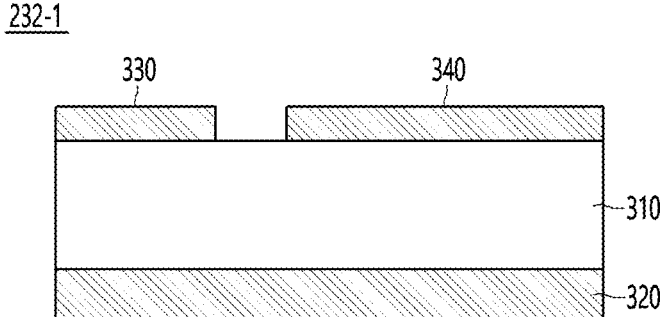
FIG. 5 is a cross-sectional view illustrating the first power semiconductor device illustrated in FIG. 4.

FIG. 5 is a cross-sectional view illustrating the first power semiconductor device illustrated in FIG. 4.

Although the first power semiconductor device 232-1 is illustrated among the power semiconductor devices (232-1 and 232-2 of FIG. 4) in FIG. 5, the structure of the second power semiconductor device 232-2 may be the same as the structure of the first power semiconductor device 232-1. Therefore, the structure of the second power semiconductor device 232-2 may be easily understood from the structure of the first power semiconductor device 232-1 illustrated in FIG. 5.

Referring to FIGS. 4 and 5, the first power semiconductor device 232-1 may comprise a first semiconductor layer 310, a first drain electrode 320, a first gate electrode 330, a first source electrode 340, etc. The second power semiconductor device 232-2 may comprise a second semiconductor layer 350, a second drain electrode 360, a second gate electrode 370, and a second source electrode 380.

The first semiconductor layer 310 and the second semiconductor layer 350 may be each formed on a substrate based on a semiconductor compound such as SiC, GaN, or $Ga_2O_3$ using a semiconductor process.

The first drain electrode 320 may be disposed on a lower side of the first semiconductor layer 310, and the first gate electrode 330 and the first source electrode 340 may be disposed on an upper side of the first semiconductor layer 310. Since the first gate electrode 330 and the first source electrode 340 are disposed on the same surface of the first semiconductor layer 310, the first gate electrode 330 and the first source electrode 340 may be positioned apart from each other so that an electrical short-circuit does not occur between them. Since the first gate electrode 330 and the first source electrode 340 are disposed on the same surface of the first semiconductor layer 310, the first power semiconductor device 232-1 may have a flip-chip structure.

The second drain electrode 360 may be disposed on a lower side of the second semiconductor layer 350, and the second gate electrode 370 and the second source electrode 380 may be disposed on an upper side of the second semiconductor layer 350. Since the second gate electrode 370 and the second source electrode 380 are disposed on the same surface of the second semiconductor layer 350, the second gate electrode 370 and the second source electrode 380 may be positioned apart from each other so that an electrical short-circuit does not occur between them. Since the second gate electrode 370 and the second source electrode 380 are disposed on the same surface of the second semiconductor layer 350, the second power semiconductor device 232-2 may have a flip-chip structure.

The common gate pad 237 may be disposed on the first power semiconductor device 232-1 and the second power semiconductor device 232-2. The common gate pad 237 may be commonly connected to the first gate electrode 330 of the first power semiconductor device 232-1 and the second gate electrode 370 of the second power semiconductor device 232-2. The common gate pad 237 may be vertically overlapped with the first gate electrode 330 of the first power semiconductor device 232-1 and electrically connected to the first gate electrode 330. The common gate pad 237 may be vertically overlapped with the second gate electrode 370 of the second power semiconductor device 232-2 and electrically connected to the second gate electrode 370. The common gate pad 237 may extend from the first gate electrode 330 of the first power semiconductor device 232-1 toward the second gate electrode 370 of the second power semiconductor device 232-2.

Meanwhile, in the conventional power converter (or inverter), a plurality of power semiconductor devices (30 and 40 in FIGS. 1A and 1B) are directly bonded to the first substrate 10 or the second substrate 20. In order to improve performance, the size (or area) of the power semiconductor devices has been gradually reduced. In order to maximize the active area of each of the reduced power semiconductor devices 30 and 40, the sizes of the gate electrodes 30a and 40a have been reduced. Therefore, bonding defects occur during the bonding process of the power semiconductor devices 30 and 40 and the first substrate 10 or the second substrate 20, and the bonding strength of the gate electrodes 30a and 40a is weak, resulting in a defect in which the power semiconductor devices 30 and 40 are detached.

However, in the present disclosure, the size (or area) of the common gate pad 237 may be greater than the size (or area) of the first power semiconductor device 232-1 or the size (or area) of the second power semiconductor device 232-2. Therefore, even if the common gate pad 237, which is greater than the size of the first power semiconductor device 232-1 or the size of the second power semiconductor device 232-2, is bonded to the first substrate 210 or the second substrate 220 to implement the power converter 200, not only does the bonding defect not occur, but the bonding strength can be greatly increased, so that a defect such as detachment can be prevented. In this way, bonding defect or detachment defect can be prevented, and thus the yield can be increased.

Meanwhile, the common source pad 239 may be disposed on the first power semiconductor device 232-1 and the second power semiconductor device 232-2. The common source pad 239 may be commonly connected to the first source electrode 340 of the first power semiconductor device 232-1 and the second source electrode 380 of the second power semiconductor device 232-2.

The common source pad 239 may be vertically overlapped with the first source electrode 340 of the first power semiconductor device 232-1 and electrically connected to the first source electrode 340. The common source pad 239 may be vertically overlapped with the second source electrode 380 of the second power semiconductor device 232-2 and electrically connected to the second source electrode 380. The common source pad 239 may extend from the first source electrode 340 of the first power semiconductor device 232-1 toward the second source electrode 380 of the second power semiconductor device 232-2.

The size of the common source pad 239 may be at least half of the sum of the size of the first power semiconductor device 232-1 and the size of the second power semiconductor device 232-2. The outer lateral part of the common source pad 239 may be disposed on outer lateral part of the first power semiconductor device 232-1 and/or the second power semiconductor device 232-2. For example, the common source pad 239 may be positioned closer to outer lateral part of the common drain pad 231 than to outer lateral part of the first source electrode 340 of the first power semiconductor device 232-1. For example, the common source pad 239 may be positioned closer to the other outer lateral part of the common drain pad 231 than to outer lateral part of the second source electrode 380 of the second power semiconductor device 232-2.

The common source pad 239 may be positioned on the same layer as the common gate pad 237. The common source pad 239 may be formed simultaneously with the common gate pad 237 using the same process as the material of the common gate pad 237. For example, the common gate pad 237 and the common source pad 239 may be each formed of a metal having excellent electrical conductivity, such as copper (Cu), but is not limited thereto.

The common source pad 239 may be positioned spaced apart from the common gate pad 237 to prevent an electrical short-circuit with the common gate pad 237. The common source pad 239 may surround the common gate pad 237.

The size (or area) of the common drain pad 231 may be greater than the sum of the size (or area) of the common gate pad 237 and the size (or area) of the common source pad 239.

In the present disclosure, since the size of the common gate pad 237 is much greater than the size (or area) of the first gate electrode 330 of the first power semiconductor device 232-1 or the size (or area) of the second gate electrode 370 of the second power semiconductor device 232-2, the common gate pad 237 may be named a scalable gate pad (hereinafter referred to as SGP). In the present disclosure, since the size of the common source pad 239 is much greater than the size of the first source electrode 340 of the first power semiconductor device 232-1 or the size of the second source electrode 380 of the second power semiconductor device 232-2, the common source pad 239 may be named a scalable source pad (hereinafter referred to as SSP).

Meanwhile, the molding layer 233 may be disposed on the peripheral region 231-3 of the common drain pad 231. The molding layer 233 may surround the lateral part of the first power semiconductor device 232-1 and the lateral part of the second power semiconductor device 232-2. The first power semiconductor device 232-1 and the second power semiconductor device 232-2 may not be exposed to the outside by the molding layer 233. The molding layer 233 may be formed of a resin material having excellent insulation performance. For example, the molding layer 233 may be formed of an epoxy molding compound (EMC) material, but is not limited thereto. The EMC material may be a sealing material that protects the first power semiconductor device 232-1 and the second power semiconductor device 232-2 from heat, moisture, impact, insulation breakdown, etc.

Meanwhile, a power semiconductor device used to implement an existing power converter was subjected to a high-voltage test of 1,200 V or more on the power semiconductor device without the molding layer disposed around it. Accordingly, sparks were emitted during the high-voltage test of 1,200 V or more on the power semiconductor device, and thus the high-voltage test could not be performed. Therefore, when the power converter is implemented using power semiconductor devices that have not undergone a high-voltage test, there is always a potential risk of breakdown due to overvoltage or rating failure of the power semiconductor device, which causes a problem of reduced product reliability.

However, in the present disclosure, a power semiconductor module (230 of FIG. 4) in which the first power semiconductor device 232-1 and the second power semiconductor device 232-2 are surrounded by the molding layer 233 may be manufactured. In the power semiconductor module (230 of FIG. 4) manufactured in this manner, even if a high voltage test of 1,200 V or more is performed on each of the first power semiconductor device 232-1 and the second power semiconductor device 232-2, a complete test is possible without sparks. Therefore, a power converter (200 of FIG. 3) according to the present disclosure may be implemented using a plurality of power semiconductor modules 230 that have undergone a complete test. Therefore, since the first power semiconductor device 232-1 and the second power semiconductor device 232-2 included in each of the plurality of power semiconductor modules 230 and 240 of the power converter (200 of FIG. 3) according to the present disclosure have undergone complete testing, potential risks such as breakdown due to overvoltage or rating failure of each of the power semiconductor devices 232-1 and 232-2 can be fundamentally blocked, thereby improving product reliability.

In addition, when manufacturing the power converter (200 of FIG. 3) according to the present disclosure using a plurality of power semiconductor modules (230 of FIG. 4) in which the first power semiconductor device 232-1 and the second power semiconductor device 232-2 are surrounded by a molding layer 233, the first power semiconductor device 232-1 and the second power semiconductor device 232-2 are not exposed to the outside, so that an electrical short-circuit due to foreign matter or dust can be prevented, thereby improving the yield.

Meanwhile, the gap between the plurality of power semiconductor devices (30 and 40 in FIG. 1A and FIG. 1B) included in the existing power converter (or inverter) is very narrow, so that the adjacent power semiconductor devices 30 and 40 are greatly affected by each other's thermal characteristics, and the heat dissipation characteristics of the heat generated from each power semiconductor device 30 and 40 are not good.

However, in the present disclosure, the separation distance d1 between the first power semiconductor device 232-1 and the second power semiconductor device 232-2 may be greater than the separation distance d2 between the common gate pad 237 and the common source pad 239. The separation distance d1 between the first power semiconductor device 232-1 and the second power semiconductor device 232-2 may be ⅓ or more of the width w1 of the first power semiconductor device 232-1 or the width w2 of the second power semiconductor device 232-2. For example, when the size (or area) of each of the first power semiconductor device 232-1 and the second power semiconductor device 232-2 is at most 5 mm×5 mm, the separation distance d1 between the first power semiconductor device 232-1 and the second power semiconductor device 232-2 may be 4 mm or more.

In this way, the separation distance d1 between the first power semiconductor device 232-1 and the second power semiconductor device 232-2 may be increased, and the molding layer 233 may be filled between the first power semiconductor device 232-1 and the second power semiconductor device 232-2, so that not only are the first power semiconductor device 232-1 and the second power semiconductor device 232-2 hardly affected by each other's thermal characteristics, but also the heat dissipation characteristics of the heat generated in the first power semiconductor device 232-1 and the second power semiconductor device 232-2 can be improved. Regarding the separation distances d1 and d2, it may be more easily understood from FIGS. 9 to 11.

Meanwhile, referring again to FIG. 4, the first power semiconductor module 230 may comprise a first gate contact 234-1, a first source contact 234-2, a second gate contact 235-1, a second source contact 235-2, an insulating layer 236, etc.

The first gate contact 234-1 and the first source contact 234-2 may be disposed on the first gate electrode 330 and the first source electrode 340, respectively, of the first power semiconductor device 232-1. The drawing illustrates that the size of the first gate contact 234-1 is the same as the size of the first gate electrode 330, and the size of the first source contact 234-2 is the same as the size of the first source electrode 340, but they may be different from each other.

The second gate contact 235-1 and the second source contact 235-2 may be disposed on the second gate electrode 370 and the second source electrode 380, respectively, of the second power semiconductor device 232-2. Although the drawing illustrates that the size of the second gate contact 235-1 is the same as the size of the second gate electrode 370 and that the size of the second source contact 235-2 is the same as the size of the second source electrode 380, they may be different from each other.

The insulating layer 236 may be disposed between the common gate pad 237 and the common source pad 239 to insulate the common gate pad 237 and the common source pad 239.

Figure 6:
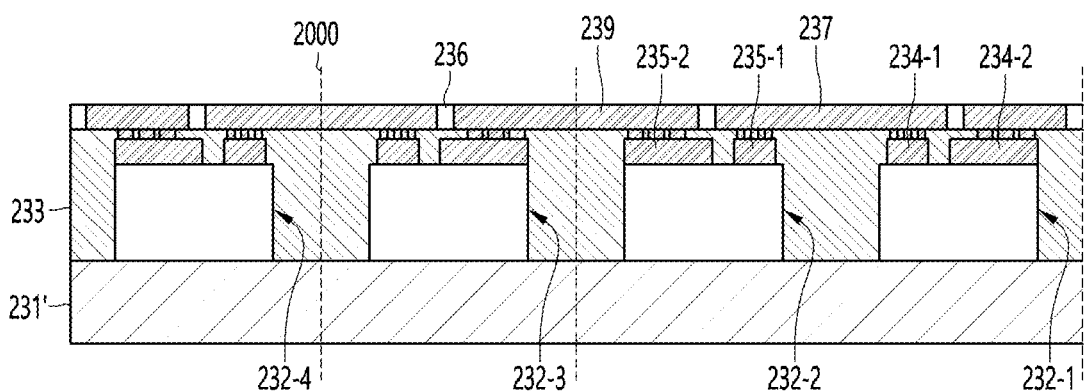
FIG. 6 is a cross-sectional view illustrating a plurality of power semiconductor devices packaged in a first aspect of the present disclosure.

As illustrated in FIG. 4, an outer lateral surface of the common drain pad 231 may be vertically aligned with an outer lateral surface of the molding layer 233. As illustrated in FIG. 6, a package (FIG. 6) packaged using a plurality of power semiconductor devices 232-1 to 232-4 may be cut, so that a power semiconductor module (230 of FIG. 7A) comprising at least two or more power semiconductor devices 232-1 and 232-2 may be manufactured, or a power semiconductor module (400 of FIG. 7B) comprising a single power semiconductor device 232-4 may be manufactured. In this way, since a power semiconductor module that may be expanded to various numbers is manufactured, in the present disclosure, the first power semiconductor module 230 and the second power semiconductor module 240 may be each named a scalable sub-module (SSM).

FIG. 6 is a cross-sectional view illustrating a plurality of power semiconductor devices packaged in a first aspect of the present disclosure.

As illustrated in FIG. 6, a plurality of power semiconductor devices 232-1 to 232-4 may be packaged on a common drain pad 231'. For example, a common drain pad 231' may be formed on a wafer (not illustrated), and a plurality of power semiconductor devices 232-1 to 232-4, a molding layer 233, a common gate pad 237, a common source pad 239, etc., may be formed on the common drain pad 231'. In FIG. 6, a lateral surface of the molding layer 233 is illustrated to be aligned with a lateral surface of the common drain pad 231', but is not limited thereto, and a lateral surface of the common drain pad 231' may be protruded to the outer lateral part of both sides more than a lateral surface of the molding layer 233.

A process opposite to the above-described process may also be performed. For example, a plurality of power semiconductor devices 232-1 to 232-4 may be attached on common gate pads 237 and common source pads 239 prepared in advance, and a common drain pad 231' may be attached on the plurality of power semiconductor devices 232-1 to 232-4. In addition, a molding layer 233 may be formed around each of the plurality of power semiconductor devices 232-1 to 232-4.

Figure 7A:
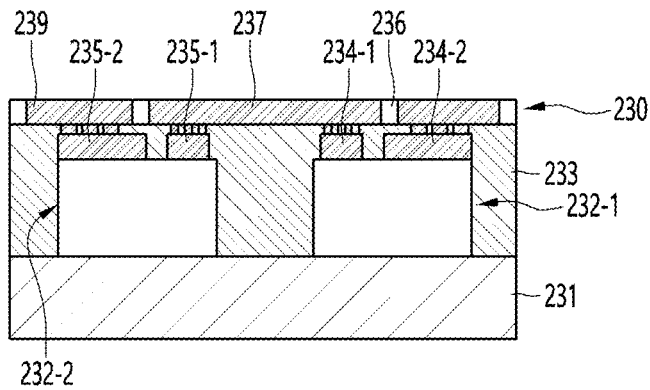
FIG. 7A is a cross-sectional view illustrating a power semiconductor module having two power semiconductor devices by cutting the wafer illustrated in FIG. 6.
Figure 7B:
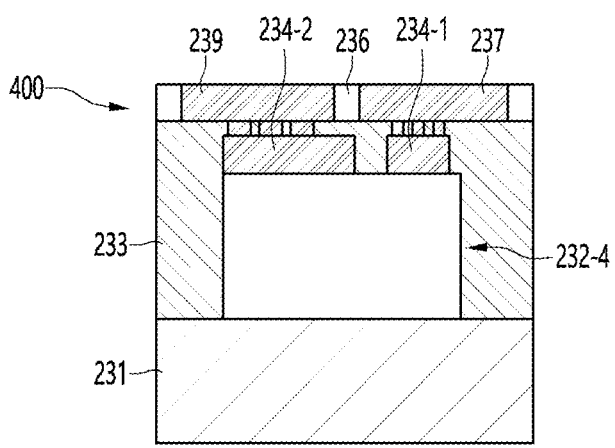
FIG. 7B is a cross-sectional view illustrating a power semiconductor module having one power semiconductor device by cutting the wafer illustrated in FIG. 6.

Thereafter, a cutting process may be performed according to a preset sawing lane 2000, whereby the power semiconductor modules 230 and 400 illustrated in FIGS. 7A and 7B may be manufactured. The wafer may be removed by performing a process such as grinding. As the wafer is removed, the common drain pad 231 may be exposed to the outside, and the exposed common drain pad 231 may be directly electrically connected to the circuit pattern of the first substrate 210 or the second substrate 220 using a bonding agent such as Ag paste, as illustrated in FIG. 3.

Accordingly, after a plurality of power semiconductor devices 232-1 to 232-4 are packaged on the common drain pad 231', they are cut according to the sawing lane 2000 set in consideration of the number of power semiconductor devices 232-1 to 232-4 desired by the customer, so that the power semiconductor modules 230 and 400 may be easily manufactured according to the number of power semiconductor devices 232-1 to 232-4, and thus the degree of freedom in the manufacture of the power semiconductor modules 230 and 400 can be maximized.

FIG. 8 illustrates a view in which a plurality of power semiconductor modules are mounted on the first substrate.

As illustrated in FIG. 8, in order to implement the power converter 200 according to the present disclosure, a plurality of power semiconductor modules 230, 240, 260, and 270 may be mounted on the first substrate 210 using a bonding process. For example, a plurality of power semiconductor modules 230, 240, 260, and 270 may be bonded on the first substrate 210 using a bonding agent such as Ag paste.

For example, a common drain pad of each of the first power semiconductor module 230 and the third power semiconductor module 260 may be bonded to a first circuit pattern of the first substrate 210. For example, a common gate pad of each of the second power semiconductor module 240 and the fourth power semiconductor module 270 may be bonded to a second circuit pattern of the first substrate 210, and a common source pad of each of the second power semiconductor module 240 and the fourth power semiconductor module 270 may be bonded to a third circuit pattern of the first substrate 210.

After the second substrate (not illustrated) is positioned on the first substrate 210, it may be bonded to a plurality of power semiconductor modules 230, 240, 260, and 270. In this instance, the common gate pad of each of the first power semiconductor module 230 and the third power semiconductor module 260 may be bonded to a fourth circuit pattern of the second substrate, and the common source pad of each of the first power semiconductor module 230 and the third power semiconductor module 260 may be bonded to a fifth circuit pattern of the second substrate. The common drain pad of each of the second power semiconductor module 240 and the fourth power semiconductor module 270 may be bonded to a sixth circuit pattern of the second substrate. The third circuit pattern and the sixth circuit pattern may be commonly connected to an output terminal.

Thereafter, an EMC molding process may be performed so that a molding layer (not illustrated) is formed between at least the first substrate 210 and the second substrate, thereby manufacturing the power converter 200. In order to distinguish it from the molding layer 233 of the power semiconductor module (230 of FIG. 4), the molding layer 233 of the power semiconductor module 230 may be named a first molding layer, and the molding layer between the first substrate 210 and the second substrate may be named a second molding layer.

Figure 9:
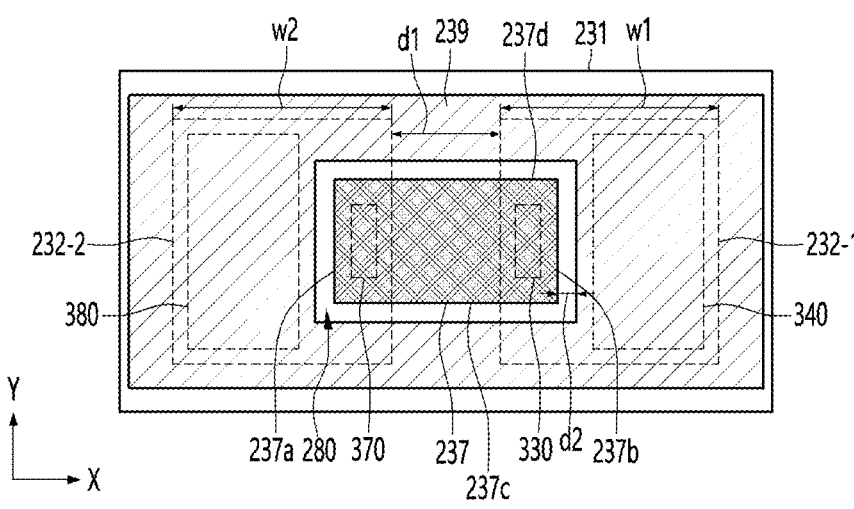
FIG. 9 is a first diagram illustrating a layout of a common gate pad and a common source pad according to the present disclosure.

FIG. 9 is a first diagram illustrating a layout of a common gate pad and a common source pad according to the present disclosure.

As illustrated in FIG. 9, a first power semiconductor device 232-1 and a second power semiconductor device 232-2 may be disposed on a common drain pad 231.

The first power semiconductor device 232-1 may comprise a first gate electrode 330 and a first source electrode 340 disposed on the same surface, that is, on the upper surface of the first semiconductor layer (320 of FIG. 4). The second power semiconductor device 232-2 may comprise a second gate electrode 370 and a second source electrode 380 disposed on the same surface, that is, on the upper surface of the second semiconductor layer 350. In this instance, the first source electrode 340, the first gate electrode 330, the second gate electrode 370, and the second source electrode 380 may be disposed in a line, in that order, along one direction (X-axis direction).

The distance between the first gate electrode 330 of the first power semiconductor device 232-1 and the second gate electrode 370 of the second power semiconductor device 232-2 may be smaller than the distance between the first source electrode 340 of the first power semiconductor device 232-1 and the second source electrode 380 of the second power semiconductor device 232-2.

A common gate pad 237 and a common source pad 239 may be disposed on the first power semiconductor device 232-1 and the second power semiconductor device 232-2.

The common gate pad 237 may be disposed in a center region of the common drain pad 231, and the common source pad 239 may surround the common gate pad 237.

The center region of the common drain pad 231 may be a region between the first region (231-1 of FIG. 4) and the second region (231-2 of FIG. 4) of the common drain pad 231. The outer lateral part of the common gate pad 237 may have a first short-lateral part 237a and a second short-lateral part 237b in one direction (X-axis direction). The outer lateral part of the common gate pad 237 may have a first long-lateral part 237c and a second long-lateral part 237d in a direction perpendicular to the one direction (X-axis direction), that is, in a vertical direction (Y-axis direction). The lengths of the first long lateral part 237c and the second long lateral part 237d may be greater than the lengths of each of the first short-lateral part 237a and the second short-lateral part 237b, respectively. A rectangle shape may be formed by the first short-lateral part 237a, the second short-lateral part 237b, the first long lateral part 237c, and the second long lateral part 237d. Although the drawing illustrates the common gate pad 237 as having a rectangular shape, it may be modified into another shape.

The common gate pad 237 may be vertically overlapped with the first power semiconductor device 232-1. The common gate pad 237 may be vertically overlapped with the first gate electrode 330 of the first power semiconductor device 232-1. The common gate pad 237 may be vertically overlapped with the second power semiconductor device 232-2. The common gate pad 237 may be vertically overlapped with the second gate electrode 370 of the second power semiconductor device 232-2. The size of the common gate pad 237 may be greater than the sum of the sizes of the first gate electrode 330 of the first power semiconductor device 232-1 and the second gate electrode 370 of the second power semiconductor device 232-2.

The common gate pad 237 may be disposed spaced apart from the common drain pad 231, which is exposed between the first power semiconductor device 232-1 and the second power semiconductor device 232-2, at a position that is spatially overlapped in a vertical direction. The first short-lateral part 237a of the common gate pad 237 may be positioned between the second gate electrode 370 and the second source electrode 380 of the second power semiconductor device 232-2. The second short-lateral part 237b of the common gate pad 237 may be positioned between the first gate electrode 330 and the first source electrode 340 of the first power semiconductor device 232-1.

The common source pad 239 may be vertically overlapped with the first power semiconductor device 232-1. The common source pad 239 may be vertically overlapped with the first source electrode 340 of the first power semiconductor device 232-1. The common source pad 239 may be vertically overlapped with the second power semiconductor device 232-2. The common source pad 239 may be vertically overlapped with the second source electrode 380 of the second power semiconductor device 232-2.

The size of the common gate pad 237 may be greater than the sum of the sizes of the first source electrode 340 of the first power semiconductor device 232-1 and the second source electrode 380 of the second power semiconductor device 232-2. Therefore, even if the common gate pad 237, which is greater than the size of the first power semiconductor device 232-1 or the size of the second power semiconductor device 232-2, is bonded to the first substrate 210 or the second substrate 220 to implement the power converter 200, not only does bonding defect not occur, but also the bonding strength can be significantly increased, so that defects such as detachment can be prevented. In this way, bonding defect or detachment defect can be prevented, and the yield can be increased.

Meanwhile, the common source pad 239 may surround at least two outer lateral parts of the common gate pad 237.

As illustrated in FIG. 9, the common source pad 239 may have a closed-loop structure surrounding the common gate pad 237. The common source pad 239 has an opening 280, and the common gate pad 237 may be positioned in the opening 280. In this instance, the inner lateral part of the common source pad 239 may be disposed to be spaced apart from the outer lateral part of the common gate pad 237.

The common source pad 239 may be disposed on the first short-lateral part 237a, the second short-lateral part 237b, the first long-lateral part 237c, and the second long-lateral part 237d of the common gate pad 237. The common source pad 239 may be disposed spaced apart from the first short-lateral part 237a of the common gate pad 237. The common source pad 239 may be disposed spaced apart from the second short-lateral part 237b of the common gate pad 237. The common source pad 239 may be disposed spaced apart from the first long-lateral part 237c of the common gate pad 237. The common source pad 239 may be disposed spaced apart from the second long-lateral part 237d of the common gate pad 237.

As illustrated in FIG. 9, the size of the common drain pad 231 may be greater than the sum of the size of the common gate pad 237 and the size of the common source pad 239. In this way, since the size of the common drain pad 231 is greatly expanded, heat generated from the first power semiconductor device 232-1 and the second power semiconductor device 232-2 can be quickly released to the outside. Therefore, as described above, the common drain pad 231 may serve as a heat dissipation member.

Figure 10:
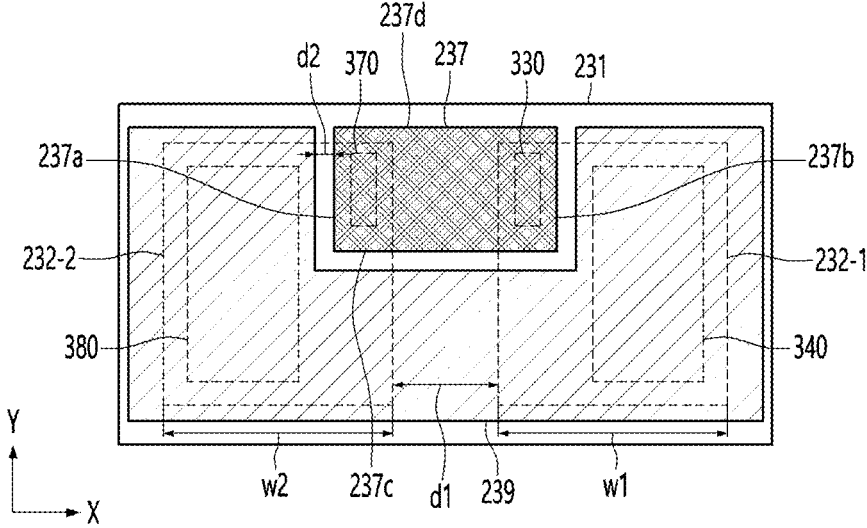
FIG. 10 is a second diagram illustrating a layout of a common gate pad and a common source pad according to the present disclosure.

FIG. 10 is a second diagram illustrating a layout of a common gate pad and a common source pad according to the present disclosure.

FIG. 10 is the same as FIG. 9, except for the position of the first gate electrode 330 of the first power semiconductor device 232-1, the position of the second gate electrode 370 of the second power semiconductor device 232-2, the position of the common gate pad 237, and the position of the common source pad 239. Therefore, components having the same shape, structure, and/or function are given the same drawing reference numerals and detailed descriptions thereof will be omitted hereinafter.

As illustrated in FIG. 10, the first gate electrode 330 of the first power semiconductor device 232-1 may be positioned in one corner region. The second gate electrode 370 of the second power semiconductor device 232-2 may be positioned in one corner region.

The common gate pad 237 may be disposed spaced apart on one side region of the common drain pad 231, at a position that is spatially overlapped in a vertical direction. The common gate pad 237 may be vertically overlapped with the first gate electrode 330 of the first power semiconductor device 232-1 and may be vertically overlapped with the second gate electrode 370 of the second power semiconductor device 232-2.

As illustrated in FIG. 10, the common source pad 239 may have an open structure surrounding the common gate pad 237. That is, the common source pad 239 may be disposed on the first short-lateral part 237a, the second short-lateral part 237b, and the first long-lateral part 237c of the common gate pad 237. Alternatively, the common source pad 239 may not be disposed on the second long-lateral part 237d of the common gate pad 237, but is not limited thereto.

Figure 11:
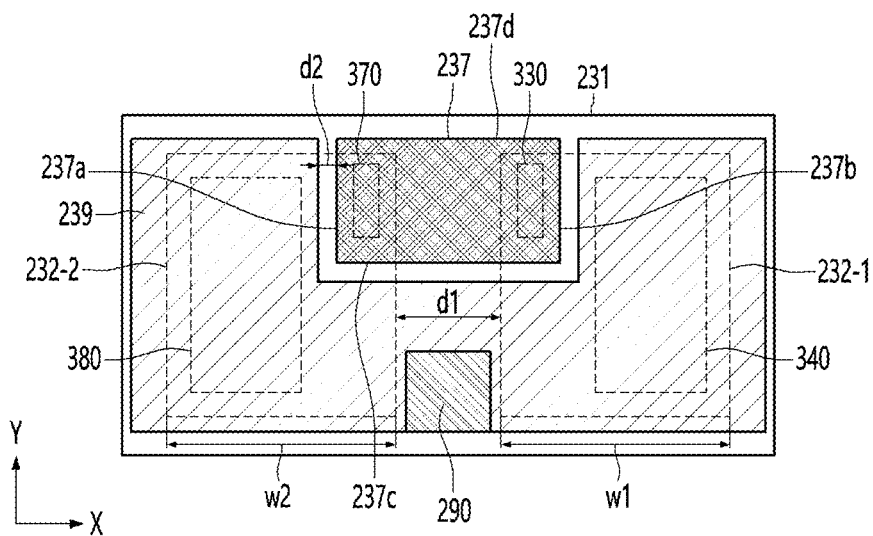
FIG. 11 is a third diagram illustrating a layout of a common gate pad and a common source pad according to the present disclosure.

FIG. 11 is a third diagram illustrating a layout of a common gate pad and a common source pad according to the present disclosure.

Except for the Kelvin source pad 290 in FIG. 11, it is the same as FIG. 10. Therefore, components having the same shape, structure, and/or function are given the same drawing reference numerals and detailed descriptions thereof will be omitted hereinafter. The Kelvin source pad 290 may also be applied to the arrangement structure of the common gate pad 237 and the common source pad 239 in FIG. 9.

Typically, a power converter 200 using power semiconductor modules comprising a first power semiconductor device 232-1 and a second power semiconductor device 232-2 used as a switch may be driven. For example, when the first power semiconductor device 232-1 and the second power semiconductor device 232-2 are turned on, the drive current may rapidly increase, and an induced voltage may be generated due to the parasitic capacitance on the source electrode. The induced voltage may flow into the gate electrode, causing a voltage drop. Accordingly, the gate-source voltage is reduced, so that the turn-on speed, i.e., the switching speed, is slowed down. Similarly, the turn-off speed is be reduced in turn-off.

To address this issue, in the present disclosure, a Kelvin source pad 290 may be provided. The Kelvin source pad 290 may be a pad to which a Kelvin source (or driver), which supplies a voltage separate from the gate voltage supplied to the common gate pad 237, is to be connected. Accordingly, by supplying a voltage, which is separate from and different from the gate voltage, to the Kelvin source pad 290 via the Kelvin source, the above-described problem can be resolved.

In the case where the power converter 200 is implemented using power semiconductor devices, there was a problem that it was difficult to allocate a part of the source electrode to the Kelvin source pad 290 because the size of the power semiconductor devices was very small.

However, in the aspect, as described above, the size of the common source pad 239 may be formed to be at least greater than the size of the first power semiconductor device 232-1 or the size of the second power semiconductor device 232-2. Accordingly, as illustrated in FIG. 11, a part of the common source pad 239 may be allocated as a Kelvin source pad 290. That is, as illustrated in FIG. 10, since the size of the common source pad 239 is sufficiently wide, a part of the common source pad 239 disposed on a region between the first power semiconductor device 232-1 and the second power semiconductor device 232-2 may be disposed as a Kelvin source pad 290. Although the Kelvin source pad 290 is illustrated in the drawing as having a square shape, various shapes are possible. Since the voltage from the Kelvin source is supplied to the Kelvin source pad 290, the generation of the induced voltage on the common source pad 239 can be suppressed, and thus a decrease in the switching speed can be prevented.

Meanwhile, in FIGS. 9 to 11, the first source electrode 340 and the second source electrode 380 are each illustrated as a rectangle shape, but they may have other shapes, for example, shapes surrounding the first gate electrode 330 and the second gate electrode 370, respectively.

Figure 12:
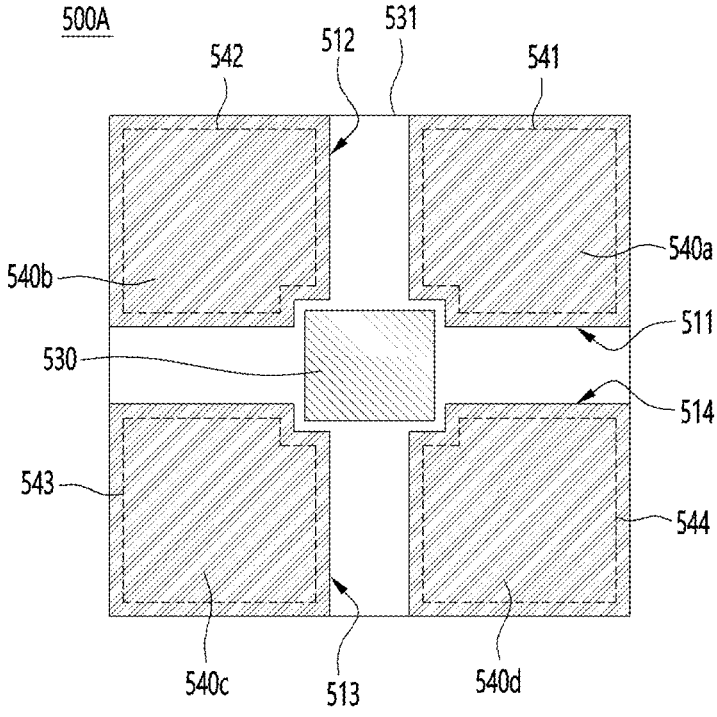
FIG. 12 is a fourth diagram illustrating a layout of a power semiconductor module according to the present disclosure.

FIG. 12 is a fourth diagram illustrating a layout of a power semiconductor module according to the present disclosure.

The power semiconductor module 500A of the aspect illustrated in FIG. 12 may adopt the technical features of the power semiconductor module based on FIGS. 9 to 11 described above, and hereinafter, a description will be given mainly with reference to the technical features of the power semiconductor module 500A illustrated in FIG. 12.

The power semiconductor module 500A of the aspect illustrated in FIG. 12 is an example in which four power semiconductor devices 511 to 514 are disposed on a common drain pad 531 to form one module, and a common gate pad 530 is disposed on the four power semiconductor devices 511 to 514.

For example, the first to fourth power semiconductor devices 511 to 514 may comprise first to fourth source electrodes 541 to 544 and first to fourth gate electrodes (not illustrated), respectively.

In the power semiconductor module 500A, the first to fourth power semiconductor devices 511 to 514 may comprise first to fourth source pads 540a to 540d disposed on the first to fourth source electrodes 541 to 544, respectively.

In addition, the power semiconductor module 500A may comprise a common gate pad 530 disposed on the first to fourth gate electrodes of the first to fourth power semiconductor devices 511 to 514.

The first to fourth source pads 540a to 540d may surround the common gate pad 530. When the power semiconductor module 500A is divided into a central region and a peripheral region, the common gate pad 530 may be disposed in the central region, and the first to fourth source pads 540a to 540d may be disposed in the peripheral region. The common gate pad 530 may vertically overlap the first to fourth gate electrodes in the central region. The common gate pad 530 may be disposed not only on the first to fourth gate electrodes in the central region, but also on regions between the first to fourth gate electrodes, so that its size may be expanded to the maximum.

The power semiconductor module 500A illustrated in FIG. 12 may be manufactured through the following manufacturing process.

First, a first lead frame comprising first to fourth source pads 540a to 540d and a common gate pad 530 may be provided. A conductive adhesive may be formed on the first lead frame using a paste printing process or a dotting process, and the first to fourth power semiconductor devices 511 to 514 may be attached to the first lead frame using the adhesive. Accordingly, the first to fourth power semiconductor devices 511 to 514 may be electrically connected to the first to fourth source pads 540a to 540d and the common gate pad 530.

Thereafter, a conductive adhesive may be formed on a second lead frame comprising a common drain pad 531 using a paste printing process. Thereafter, the second lead frame may be attached to the first to fourth power semiconductor devices 511 to 514 using a sintering process or a soldering process. Accordingly, the first to fourth power semiconductor devices 511 to 514 may be electrically connected to the common drain pad 531.

Meanwhile, the common gate pad 530 illustrated in FIG. 12 may be disposed in various positions with various shapes, as illustrated in FIGS. 13A to 13D.

Figure 13A:
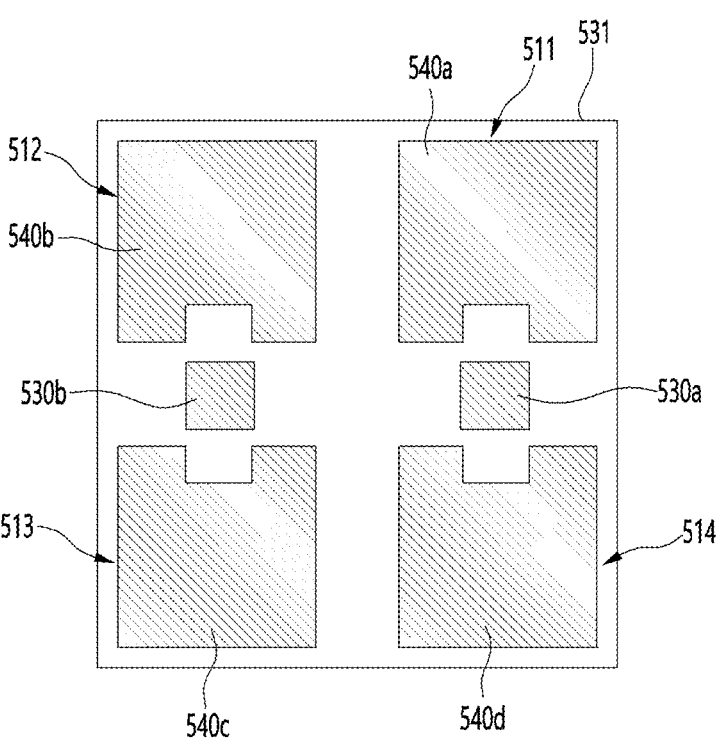
FIGS. 13A to 13D are various diagrams illustrating variations of the common gate pad illustrated in FIG. 12.
Figure 13B:
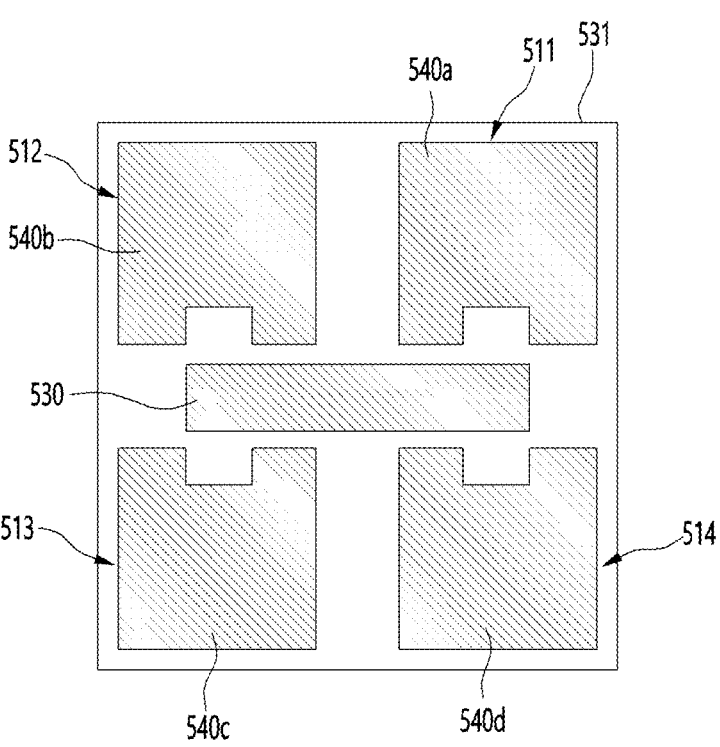
Figure 13C:
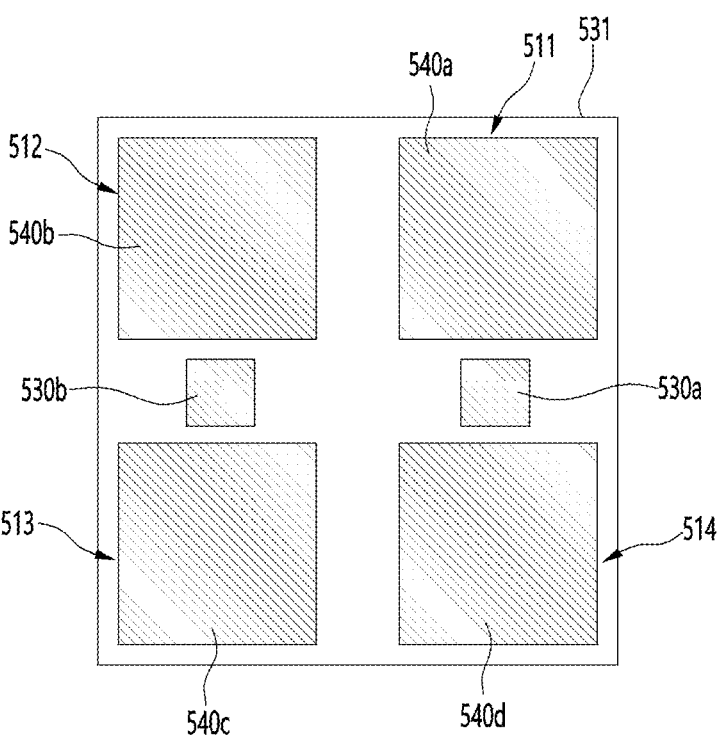

As illustrated in FIGS. 13A and 13C, a first common gate pad 530a may be disposed between a first source pad 540a and a fourth source pad 540d, and a second common gate pad 530b may be disposed between a second source pad 540b and a third source pad 540c.

Figure 13D:
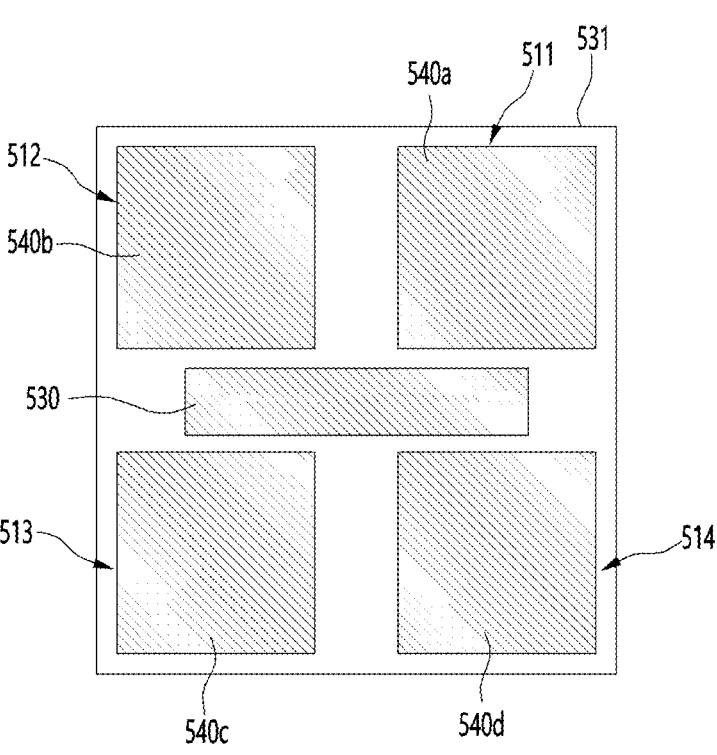

As illustrated in FIGS. 13B and 13D, the common gate pad 530 may be disposed to extend from a first region between a first source pad 540a and a fourth source pad 540d to a second region between a second source pad 540b and a third source pad 540c.

Meanwhile, unlike FIGS. 13C and 13D, in FIGS. 13A and 13B, a groove may be formed on one side of each of the first to fourth source pads 540a to 540d facing the first common gate pad 530a and the second common gate pad 530b, respectively.

Figure 14:
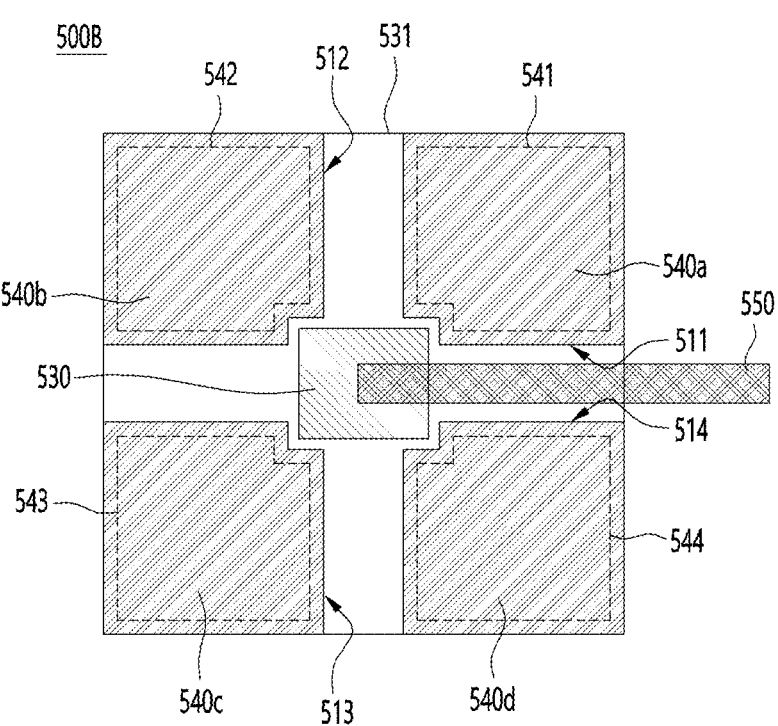
FIG. 14 is a fifth diagram illustrating a layout of a power semiconductor module according to the present disclosure.

FIG. 14 is a fifth diagram illustrating a layout of a power semiconductor module of the aspect.

The power semiconductor module 500B illustrated in FIG. 14 may be identical to the power semiconductor module 500A illustrated in FIG. 12 except for a connecting part 550.

The connecting part 550 may electrically connect the common gate pad 530 to the first substrate (210 of FIG. 3) or the second substrate (220 of FIG. 3). The connecting part 550 may extend from the upper surface of the common gate pad 530 through between the first source pad 540a and the fourth source pad 540d. Alternatively, the connecting part 550 may extend from the upper surface of the common gate pad 530 between the first source pad 540a and the second source pad 540b, between the second source pad 540b and the third source pad 540c, or between the third source pad 540c and the fourth source pad 540d.

Figure 15:
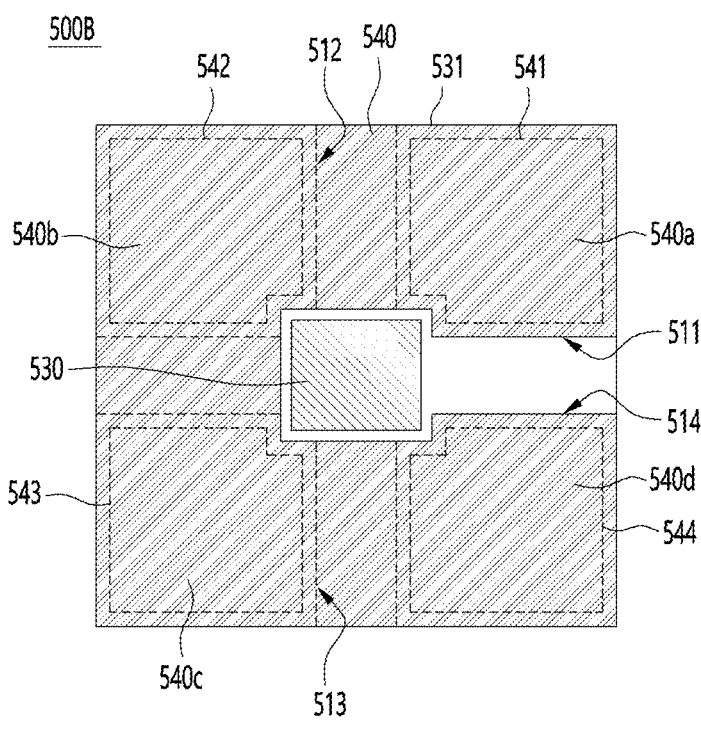
FIG. 15 is a sixth diagram illustrating a layout of a power semiconductor module according to the present disclosure.

FIG. 15 is a sixth diagram illustrating a layout of a power semiconductor module according to the present disclosure. The power semiconductor module 500C of the aspect illustrated in FIG. 15 may adopt the technical features of the power semiconductor modules based on FIGS. 9 to 12 described above, and hereinafter, a description will be given mainly with reference to the technical features of the power semiconductor module 500C illustrated in FIG. 12.

The power semiconductor module 500C of the aspect illustrated in FIG. 15 is an example in which a common gate pad 530 and a common source pad 540 are disposed on four power semiconductor devices.

For example, the power semiconductor module 500C of the aspect illustrated in FIG. 12 is an example in which four power semiconductor devices 511 to 514 are disposed on a common drain pad 531 to form one module, and a common gate pad 530 and a common source pad 540 are disposed on the four power semiconductor devices 511 to 514.

For example, the power semiconductor module 500C may comprise a common source pad 540 disposed on the first to fourth source electrodes 541 to 544 of the first to fourth power semiconductor devices 511 to 514 and a common gate pad 530 disposed on the first to fourth gate electrodes of the first to fourth power semiconductor devices 511 to 514.

In the power semiconductor module 500A illustrated in FIG. 12, the first to fourth source pads 540a to 540d may surround the common gate pad 530, whereas in the power semiconductor module 500C illustrated in FIG. 15, one common source pad 540 may surround the common gate pad 530. When the first to fourth source pads 540a to 540d are integrally formed in the power semiconductor module 500A illustrated in FIG. 12, a single common source pad 540 may be formed, as in the power semiconductor module 500C illustrated in FIG. 15.

A connecting pad (not illustrated) for electrically connecting the common gate pad 530 to the outside may be provided. The common source pad 540 may have a separation region comprising at least the disposed connecting pad so as not to be electrically short-circuited with the disposed connecting pad. The separation region may be a region where the common source pad 540 is not formed.

Meanwhile, FIG. 15 illustrates that the common gate pad 530 is disposed on the inside and the common source pad 540 is disposed on the outside, but is not limited thereto.

For example, in the additional disclosure, the common gate pad 530 may be disposed on the outside, and the common source pad 540 may be disposed on the inside.

Specifically, in the power semiconductor module 500C of the aspect, the first to fourth gate electrodes (not illustrated) of the first to fourth power semiconductor devices 511 to 514 may be disposed to be positioned at the outer corners, respectively, and the first to fourth source electrodes 541 to 544 may be disposed to be positioned on the inside.

Thereafter, the common gate pad 530 may be disposed on the first to fourth gate electrodes disposed at the outer corners, respectively, and the common source pad 540 may be disposed on the first to fourth source electrodes 541 to 544 located on the inside.

Hereinafter, a manufacturing process of the power semiconductor module according to the present disclosure will be described with reference to FIGS. 16A to 16H. Meanwhile, the manufacturing process of the power semiconductor module according to the present disclosure is not limited to the process sequence or the process contents described in FIGS. 16A to 16H, and the process sequence may be changed, some processes may be omitted, or additional processes may be added.

Figure 16A:
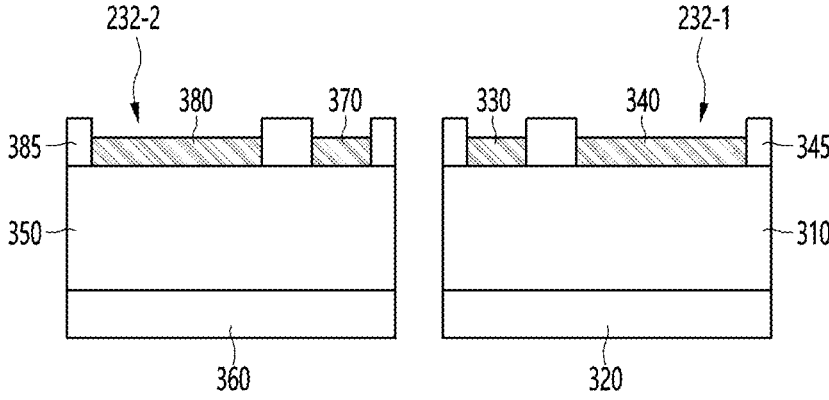
FIGS. 16A to 16H are manufacturing process diagrams of a power semiconductor module according to the present disclosure.

First, as illustrated in FIG. 16A, a plurality of power semiconductor devices, for example, a first power semiconductor device 232-1 and a second power semiconductor device 232-2, may be provided. The first power semiconductor device 232-1 may comprise a first drain electrode 320, a first semiconductor layer 310, a first gate electrode 330, and a first source electrode 340. The second power semiconductor device 232-2 may comprise a second drain electrode 360, a second semiconductor layer 350, a second gate electrode 370, and a second source electrode 380.

In the first power semiconductor device 232-1, a first insulating layer 345 may be disposed around each of the first gate electrode 330 and the second source electrode 380, so that an electrical short-circuit between the first gate electrode 330 and the first source electrode 340 can be prevented, and the first semiconductor layer 310 may be protected from heat, moisture, impact, etc. In the second power semiconductor device 232-2, a second insulating layer 385 may be disposed around each of the second gate electrode 370 and the second source electrode 380, so that an electrical short-circuit between the second gate electrode 370 and the second source electrode 380 can be prevented, and the second semiconductor layer 350 may be protected from heat, moisture, impact, etc. The first insulating layer 345 and/or the second insulating layer 385 may be formed of an inorganic insulating material, but is not limited thereto.

Figure 16B:
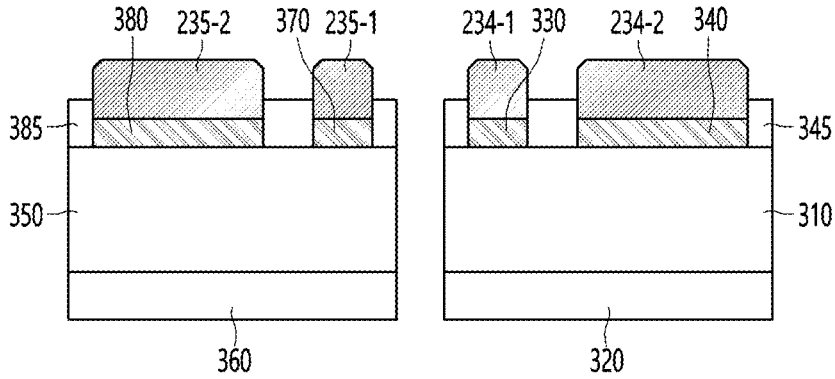

As illustrated in FIG. 16B, a sputtering and/electroplating process may be performed using the first insulating layer 345 as a mask, so that a first gate contact 234-1 and a first source contact 234-2 may be formed on the first gate electrode 330 and the first source electrode 340 of the first power semiconductor device 232-1, respectively. A sputtering and/electroplating process may be performed using the second insulating layer 385 as a mask, so that a second gate contact 235-1 and a second source contact 235-2 may be formed on the second gate electrode 370 and the second source electrode 380 of the second power semiconductor device 232-2, respectively. Here, the contact may be named a stud, a pillar, etc.

Figure 16C:
Figure 16D:
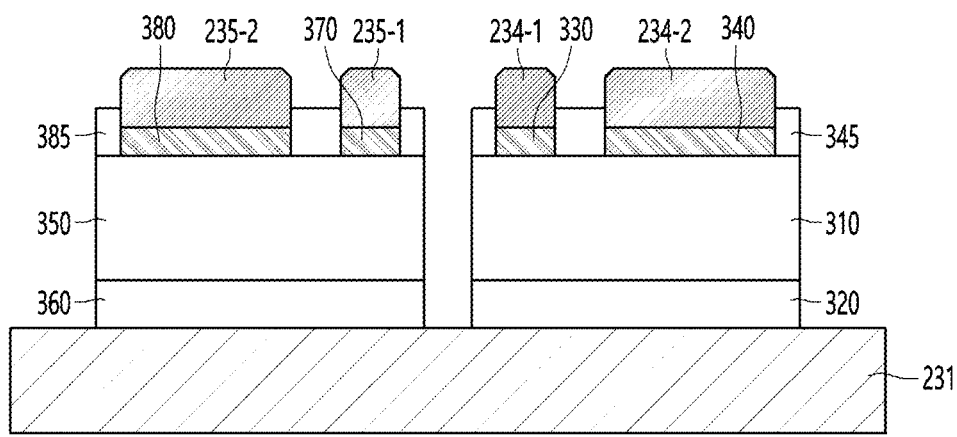
Figure 16E:
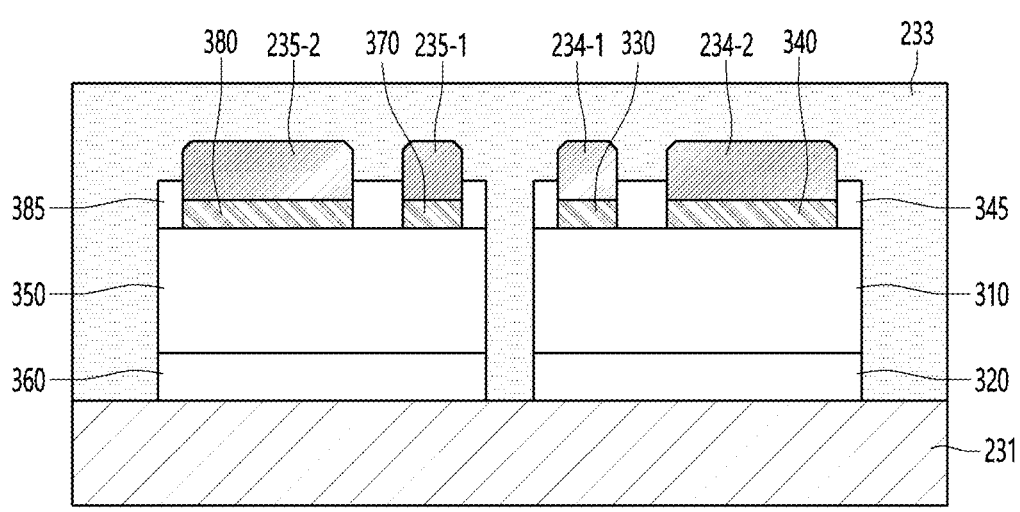

Meanwhile, unlike as illustrated in FIG. 16B, the process of forming the first gate contact 234-1 and the first source contact 234-2 on the first power semiconductor device 232-1, and the process of forming the first gate contact 235-1 and the first source contact 235-2 on the second power semiconductor device 232-2 may be formed after the process of forming the molding layer 233 by the over-molding process as illustrated in FIG. 16E.

The processes as illustrated in FIG. 16A and FIG. 16B may be performed at the wafer level. That is, after the drain electrodes 320 and 360, the semiconductor layers 310 and 350, the insulating layers 345 and 385, a plurality of gate electrodes 330 and 370, a plurality of source electrodes 340 and 380, a plurality of gate contacts 234-1 and 235-1, and a plurality of source contacts 234-2 and 235-2 are formed on a wafer (not illustrated), a cutting process may be performed. Accordingly, a first power semiconductor device 232-1 and a second power semiconductor device 232-2 may be formed from the wafer. The wafer may be removed before or after performing the cutting process.

As illustrated in FIG. 16C, a common drain pad 231 may be provided. The common drain pad 231 may be formed of a metal material having excellent electrical conductivity. For example, the common drain pad 231 may have a three-layer structure of copper (Cu)-molybdenum (Mo)-copper (Cu).

As illustrated in FIG. 16D, the first power semiconductor device 232-1 and the second power semiconductor device 232-2 may be bonded on the common drain pad 231. For example, the first power semiconductor device 232-1 and the second power semiconductor device 232-2 may be bonded on the common drain pad 231 using a sintering process. A bonding agent such as Ag paste may be used for a given process, but is not limited thereto.

Figure 16F:
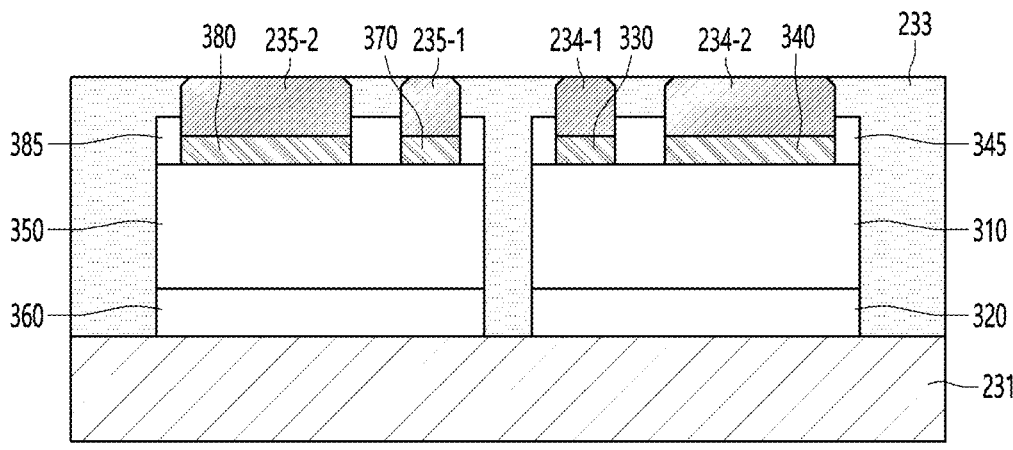

As illustrated in FIG. 16E, a molding layer 233 may be formed on the first power semiconductor device 232-1 and the second power semiconductor device 232-2 using an EMC molding process. Thereafter, as illustrated in FIG. 16F, the molding layer 233 on the first power semiconductor device 232-1 and the second power semiconductor device 232-2 may be removed using an EMC grinding process. Accordingly, the upper surface of the molding layer 233 and the upper surfaces of the first gate contact 234-1, the first source contact 234-2, the second gate contact 235-1, and the second source contact 235-2 may be positioned on the same horizontal line. Meanwhile, as previously described, unlike that illustrated in FIG. 16E, the process of forming the first gate contact 234-1 and the first source contact 234-2 on the first power semiconductor device 232-1, and the process of forming the first gate contact 235-1 and the first source contact 235-2 on the second power semiconductor device 232-2 may be performed after the process of forming the molding layer 233 by the over-molding process illustrated in FIG. 16E.

For example, the over-molded molding layer 233 may be ground to expose the first gate electrode 330, the first source electrode 340 of the first power semiconductor device 232-1 and the second gate electrode 370, the second source electrode 380 of the second power semiconductor device 232-2.

Figure 16G:
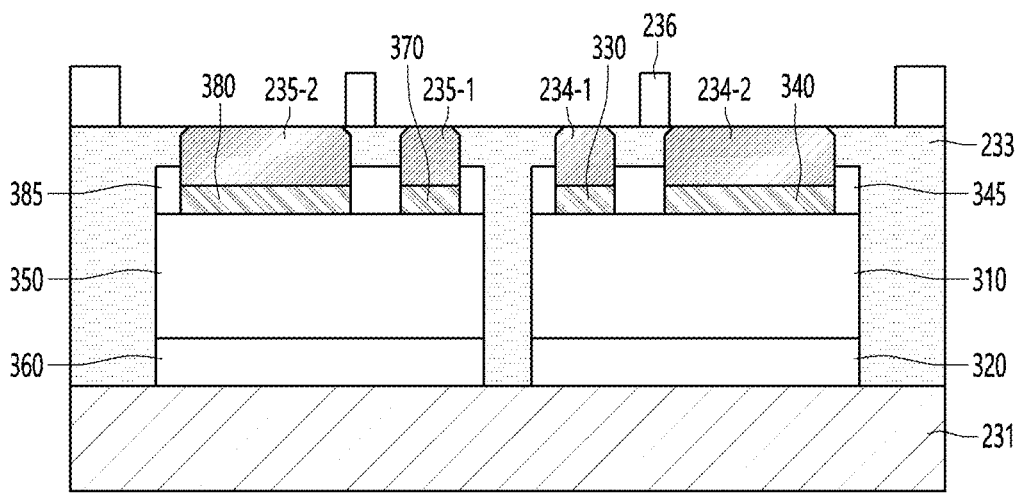
Figure 16H:
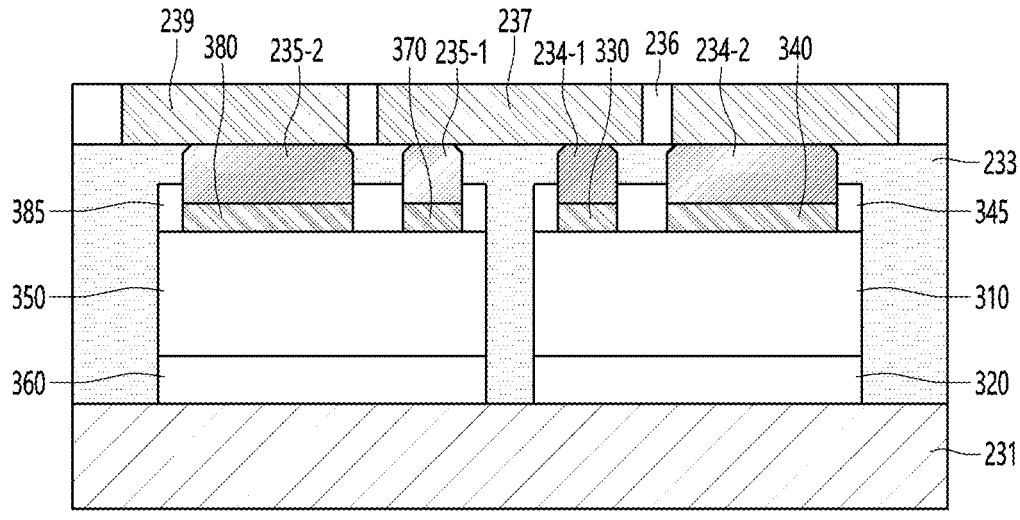

As in FIG. 16H, a process of forming the first gate contact 234-1 and the first source contact 234-2 on the first power semiconductor device 232-1, a process of forming the first gate contact 235-1 and the first source contact 235-2 on the second power semiconductor device 232-2, and a process of forming the common gate pad 237 and the common source pad 239 may be performed thereafter.

As illustrated in FIGS. 16G and 16H, an insulating layer 236, a common gate pad 237, and a common source pad 239 may be formed. For example, after the insulating layer 236 is formed first, a sputtering and/or electroplating process may be performed using the insulating layer 236 as a mask to form the common gate pad 237 and the common source pad 239. The insulating layer 236 may be formed on a remaining region except for a region where the common gate pad 237 and the common source pad 239 are to be formed. The common gate pad 237 and the common source pad 239 may be surrounded by the insulating layer 236. As described above, the size of each of the common gate pad 237 and the common source pad 239 may be expanded. The size of each of the common gate pad 237 and the common source pad 239 can be freely adjusted by the layout of the insulating layer 236.

Meanwhile, the insulating layer 236 may protect the first power semiconductor device 232-1 and the second power semiconductor device 232-2 from heat, moisture, etc., and thus may be named a passivation layer. The insulating layer 236 may be formed of an inorganic insulating material, but is not limited thereto.

Figure 17:
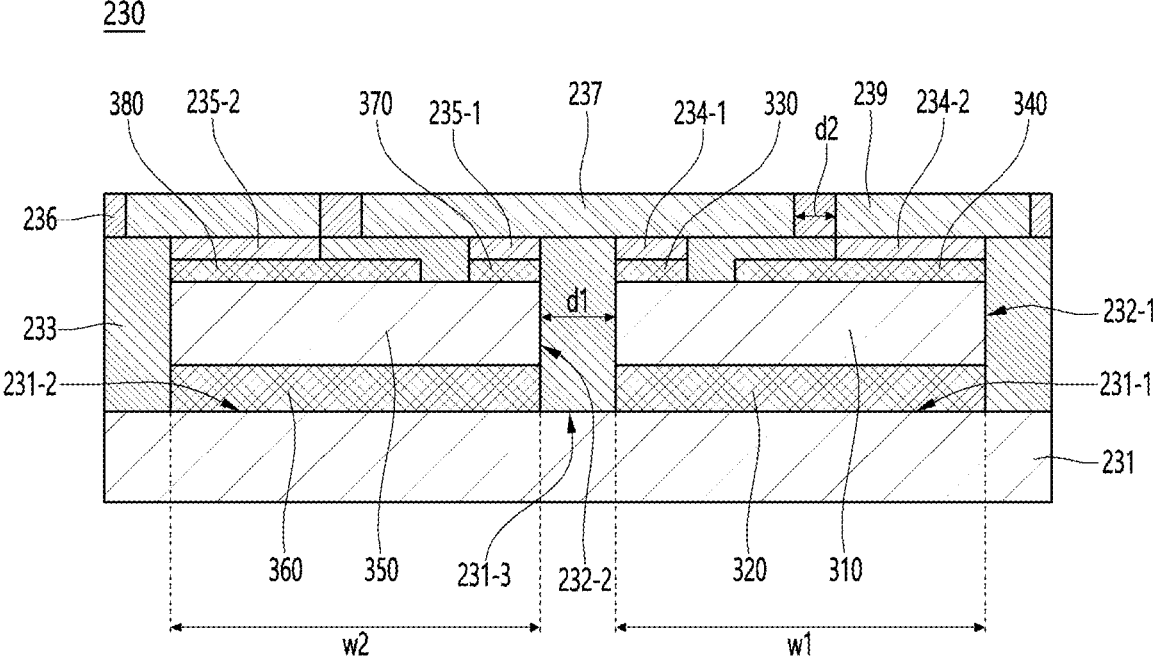
FIG. 17 is a cross-sectional diagram illustrating a power semiconductor module according to the present disclosure.

FIG. 17 is a cross-sectional view illustrating a power semiconductor module according to the present disclosure.

Although FIG. 17 illustrates the first power semiconductor module 230 among a plurality of power semiconductor modules (230, 240, 260, and 270 of FIG. 8), the structure of each of the second power semiconductor module 240, the third power semiconductor module 260, and the fourth power semiconductor module 270 may be identical to the structure of the first power semiconductor module 230 illustrated in FIG. 17. Therefore, the structure of each of the second power semiconductor module 240, the third power semiconductor module 260, and the fourth power semiconductor module 270 may be easily understood from the structure of the first power semiconductor module 230 illustrated in FIG. 17.

The second aspect (FIG. 17) of the present disclosure is identical to the first aspect (FIG. 4) of the present disclosure, except that each of the common gate pads 237 and 247 is further enlarged. In the second aspect (FIG. 17) of the present disclosure, components having the same shape, structure, and/or function are given the same drawing reference numerals as those in the first aspect (FIG. 4) of the present disclosure, and detailed descriptions thereof will be omitted. The omitted description in the second aspect (FIG. 17) of the present disclosure may be easily understood from the description of the first aspect (FIG. 4) of the present disclosure.

As illustrated in FIG. 17, the first power semiconductor module 230 may comprise a first power semiconductor device 232-1, a second power semiconductor device 232-2, a molding layer 233, etc.

Referring to FIG. 5 and FIG. 17, the first power semiconductor device 232-1 may comprise a first semiconductor layer 310, a first drain electrode 320, a first gate electrode 330, a first source electrode 340, etc. The second power semiconductor device 232-2 may comprise a second semiconductor layer 350, a second drain electrode 360, a second gate electrode 370, a second source electrode 380.

The common gate pad 237 may be commonly connected to the first gate electrode 330 of the first power semiconductor device 232-1 and the second gate electrode 370 of the second power semiconductor device 232-2. The common gate pad 237 may extend from the first gate electrode 330 of the first power semiconductor device 232-1 toward the second gate electrode 370 of the second power semiconductor device 232-2.

The common gate pad 237 may be disposed on not only the first power semiconductor device 232-1 but also the second power semiconductor device 232-2, so that its size (or area) can be maximally expanded.

The common gate pad 237 may be vertically overlapped with the first gate electrode 330 of the first power semiconductor device 232-1, the first source electrode 340 of the first power semiconductor device 232-1, the first gate electrode 330 of the second power semiconductor device 232-2, and the second source electrode 380 of the second power semiconductor device 232-2, respectively.

The common gate pad 237 may extend from the center region of the common drain pad 231 to the first source electrode 340 via the first gate electrode 330 of the first power semiconductor device 232-1, and may be vertically overlapped with the first source electrode 340. The common gate pad 237 may extend from the central region of the common drain pad 231 to the second source electrode 380 via the second gate electrode 370 of the second power semiconductor device 232-2, and may vertically overlap with the second source electrode 380. The central region of the common drain pad 231 may be a region between the first region (231-1 of FIG. 17) and the second region (231-2 of FIG. 17) of the common drain pad 231.

In this way, since the size (or area) of the common gate pad 237 is maximized, bonding defect or detachment defect can be prevented, and thus the yield can be improved.

An insulating layer may be disposed between the common gate pad 237 and the first source electrode 340 and between the common gate pad 237 and the second source electrode 380, so that an electrical short-circuit between them can be prevented.

Meanwhile, the common source pad 239 may be disposed on the first power semiconductor device 232-1 and the second power semiconductor device 232-2. The common source pad 239 may be commonly connected to the first source electrode 340 of the first power semiconductor device 232-1 and the second source electrode 380 of the second power semiconductor device 232-2.

The common source pad 239 may be vertically overlapped with the first source electrode 340 of the first power semiconductor device 232-1 and electrically connected to the first source electrode 340. The common source pad 239 may be vertically overlapped with the second source electrode 380 of the second power semiconductor device 232-2 and electrically connected to the second source electrode 380. The common source pad 239 may extend from the first source electrode 340 of the first power semiconductor device 232-1 toward the second source electrode 380 of the second power semiconductor device 232-2.

The size (or area) of the common source pad 239 may be greater than the size (or area) of the first power semiconductor device 232-1 or the size (or area) of the second power semiconductor device 232-2. The outer lateral part of the common source pad 239 may be disposed on outer lateral part of the first power semiconductor device 232-1 and/or the second power semiconductor device 232-2. For example, the common source pad 239 may be positioned closer to outer lateral part of the common drain pad 231 than to outer lateral part of the first source electrode 340 of the first power semiconductor device 232-1. For example, the common source pad 239 may be positioned closer to the other outer lateral part of the common drain pad 231 than to outer lateral part of the second source electrode 380 of the second power semiconductor device 232-2.

The common source pad 239 may be positioned spaced apart from the common gate pad 237 to prevent an electrical short-circuit with the common gate pad 237. The common source pad 239 may surround the common gate pad 237.

The size (or area) of the common drain pad 231 may be greater than the sum of the size (or area) of the common gate pad 237 and the size (or area) of the common source pad 239.

Figure 18:
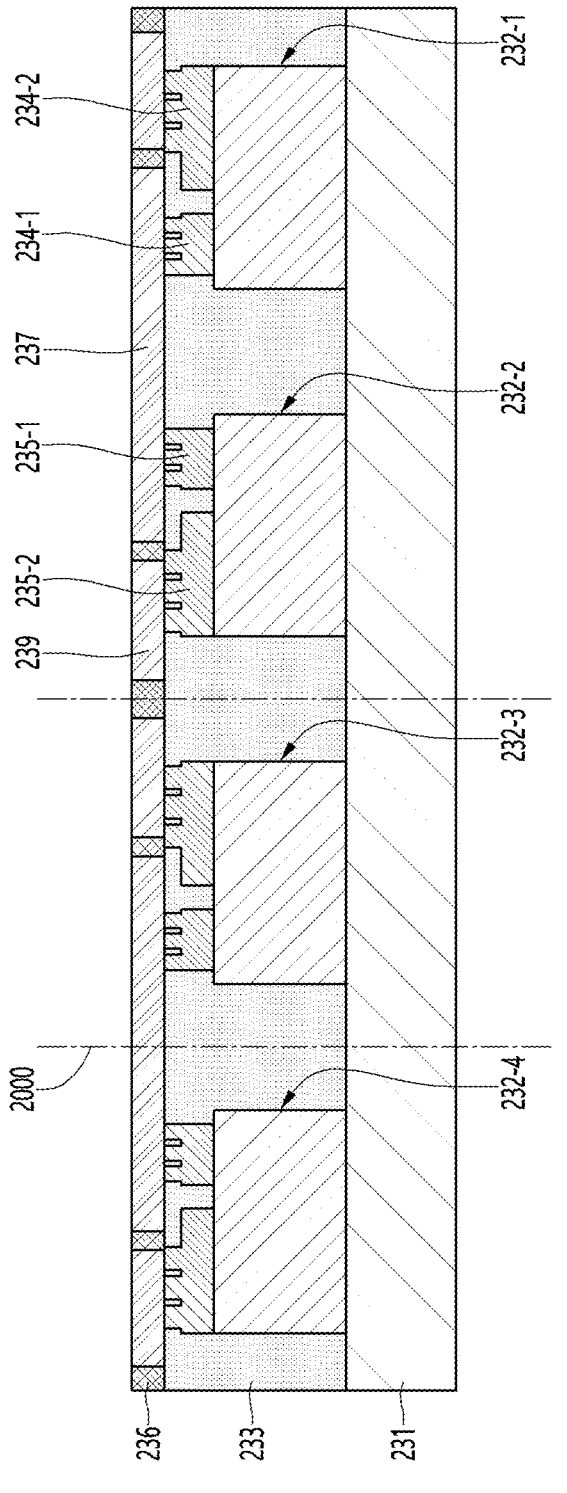
FIG. 18 is a cross-sectional diagram illustrating a plurality of power semiconductor devices packaged in the present disclosure.

FIG. 18 is a cross-sectional diagram illustrating a plurality of power semiconductor devices packaged in the present disclosure.

The structure of the package illustrated in FIG. 18 is identical to the structure of the package illustrated in FIG. 6 except for the common gate pad 237 and the common source pad 239. Accordingly, in the structure of the package illustrated in FIG. 18, components having the same shape, structure, and/or function as those of the structure of the package illustrated in FIG. 6 are given the same drawing symbols, and detailed descriptions thereof will be omitted. As illustrated in FIG. 18, a plurality of power semiconductor devices 232-1 to 232-4 may be packaged on the common drain pad 231. For example, a common drain pad 231 may be formed on a wafer (not illustrated), and a plurality of power semiconductor devices 232-1 to 232-4, a molding layer 233, a common gate pad 237, a common source pad 239, etc., may be formed on the common drain pad 231.

Thereafter, the cutting process is performed according to the preset sawing lane 2000, so that the power semiconductor modules 230 and 400 may be manufactured.

Figure 19A:
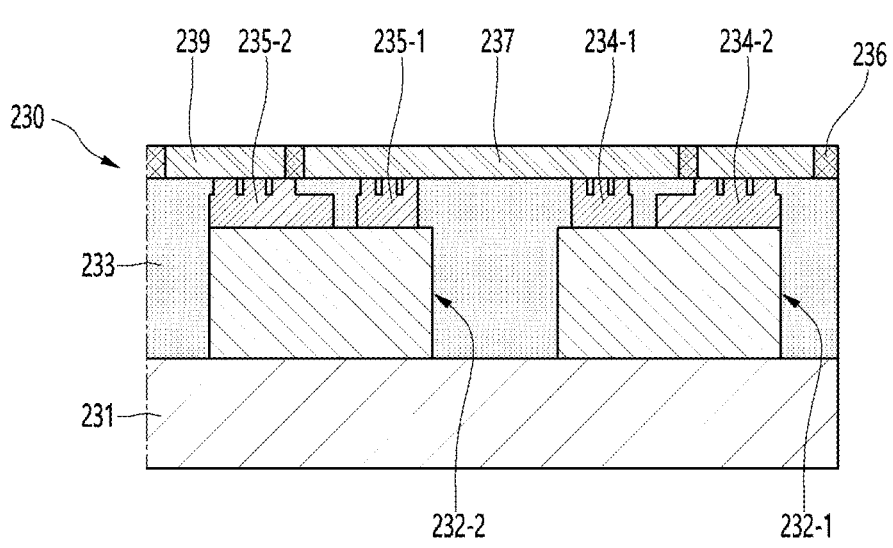
FIG. 19a is a cross-sectional view illustrating a power semiconductor module having two power semiconductor devices by cutting the wafer illustrated in FIG. 18.
Figure 19B:
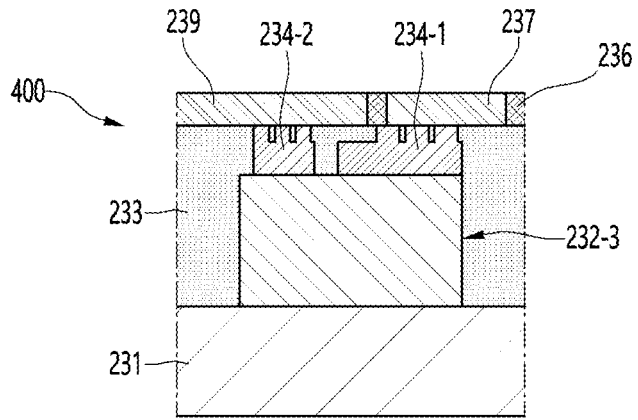
FIG. 19b is a cross-sectional view illustrating a power semiconductor module having one power semiconductor device by cutting the wafer illustrated in FIG. 18.

Accordingly, after the plurality of power semiconductor devices 232-1 to 232-4 are packaged on the common drain pad 231, they may be cut according to the preset sawing lane 2000 in consideration of the number of power semiconductor devices 232-1 to 232-4 desired by the customer, so that the power semiconductor modules 230 and 400 may be easily manufactured according to the number of power semiconductor devices 232-1 to 232-4 as illustrated in FIGS. 19A and 19B. Thus, the degree of freedom in the manufacture of the power semiconductor modules 230 and 400 can be maximized.

Figure 20:
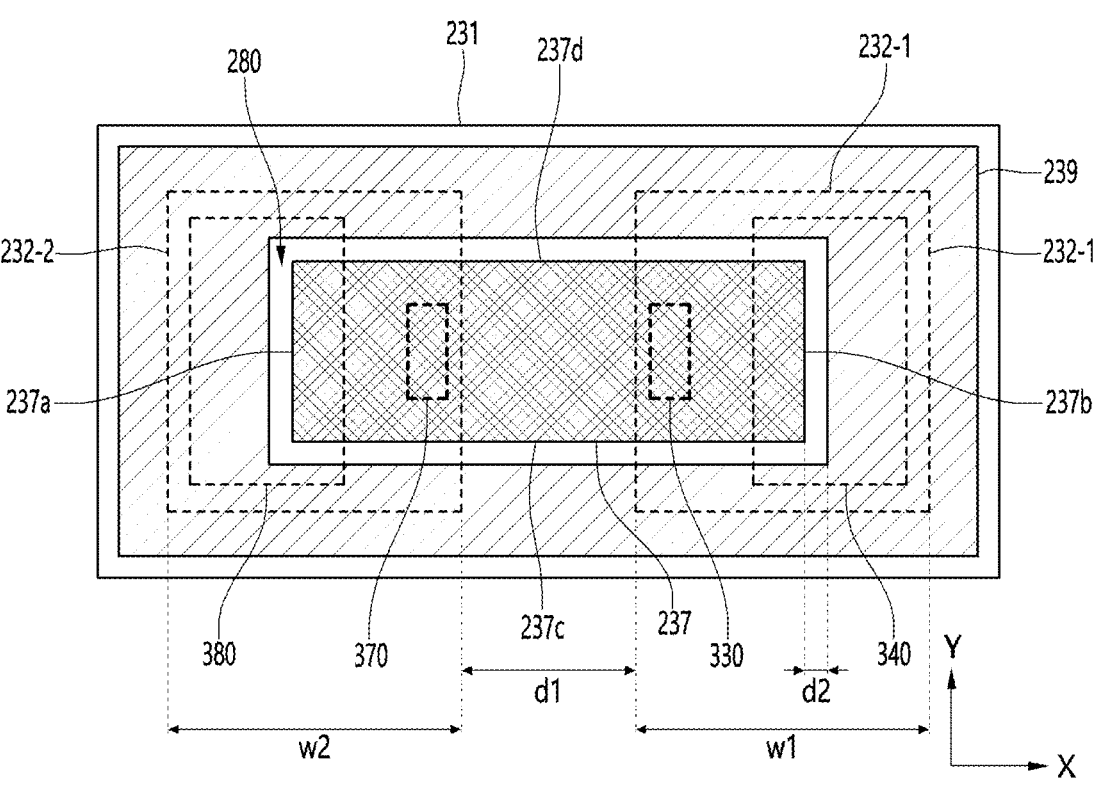
FIG. 20 is a seventh diagram illustrating the layout of a common gate pad and a common source pad according to the present disclosure.

FIG. 20 is a seventh diagram illustrating a layout of a common gate pad and a common source pad according to the present disclosure.

The structure of the package illustrated in FIG. 20 is identical to the structure of the package illustrated in FIG. 9 except for the common gate pad 237 and the common source pad 239. Accordingly, in the structure of the package illustrated in FIG. 20, components having the same shape, structure, and/or function as those of the structure of the package illustrated in FIG. 9 are given the same drawing reference numerals, and detailed descriptions thereof will be omitted.

As illustrated in FIG. 20, a first power semiconductor device 232-1 and a second power semiconductor device 232-2 may be disposed on a common drain pad 231.

The first source electrode 340, the first gate electrode 330, the second gate electrode 370, and the second source electrode 380 may be disposed in a line, in that order, along one direction (X-axis direction).

A common gate pad 237 and a common source pad 239 may be disposed on the first power semiconductor device 232-1 and the second power semiconductor device 232-2.

The common gate pad 237 may be disposed in a central region of the common drain pad 231, and the common source pad 239 may surround the common gate pad 237.

The common gate pad 237 may be vertically overlapped with the first power semiconductor device 232-1. The size of the common gate pad 237 may be greater than the sum of the sizes of the first gate electrode 330 of the first power semiconductor device 232-1 and the second gate electrode 370 of the second power semiconductor device 232-2.

The common gate pad 237 may be disposed spaced apart from the common drain pad 231, which is exposed between the first power semiconductor device 232-1 and the second power semiconductor device 232-2, at a position that is spatially overlapped in a vertical direction. The first short-lateral part 237a of the common gate pad 237 may be positioned on the second source electrode 380 of the second power semiconductor device 232-2. The second short-lateral part 237b of the common gate pad 237 may be positioned on the first source electrode 340 of the first power semiconductor device 232-1.

The common source pad 239 may be vertically overlapped with the first power semiconductor device 232-1. The common source pad 239 may be vertically overlapped with the second power semiconductor device 232-2.

As illustrated in FIG. 20, the size of the common drain pad 231 may be greater than the sum of the size of the common gate pad 237 and the size of the common source pad 239. In this way, since the size of the common drain pad 231 is greatly expanded, heat generated from the first power semiconductor device 232-1 and the second power semiconductor device 232-2 can be quickly released to the outside. Therefore, as described above, the common drain pad 231 may serve as a heat dissipation member.

Figure 21:
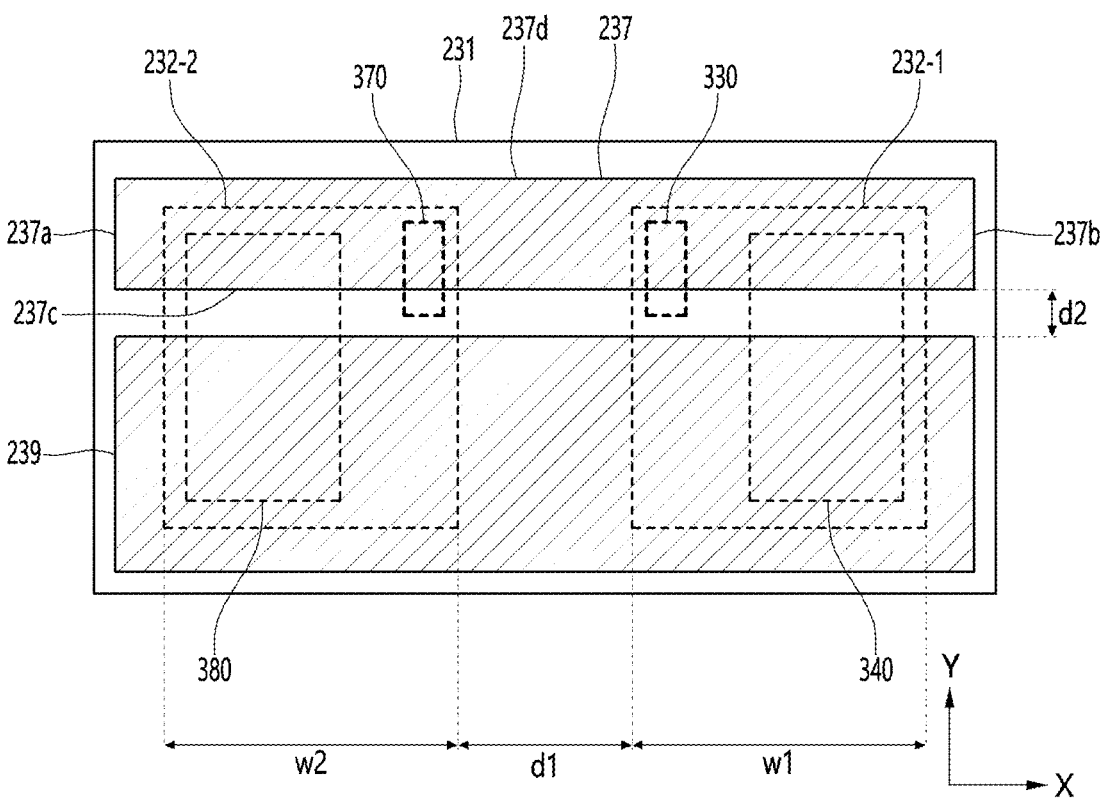
FIG. 21 is an eighth diagram illustrating the layout of a common gate pad and a common source pad according to the present disclosure.

FIG. 21 is an eighth diagram illustrating a layout of a common gate pad and a common source pad according to the present disclosure. In FIG. 21, the position of the first gate electrode 330 of the first power semiconductor device 232-1, the position of the second gate electrode 370 of the second power semiconductor device 232-2, the position of the common gate pad 237, and the shape of the common source pad 239 are the same as in FIG. 20. Therefore, components having the same shape, structure, and/or function are given the same drawing reference numerals and detailed descriptions thereof will be omitted hereinafter.

As illustrated in FIG. 21, the first gate electrode 330 of the first power semiconductor device 232-1 may be positioned in one corner region. The second gate electrode 370 of the second power semiconductor device 232-2 may be positioned in one corner region.

The common gate pad 237 and the common source pad 239 may be disposed parallel to each other along one direction (X-axis direction).

The first short-lateral part 237a of the common gate pad 237 may be positioned between the second source electrode 380 of the second power semiconductor device 232-2 and one side of the common drain pad 231. The first short-lateral part 237a of the common gate pad 237 may be positioned closer to the one side of the common drain pad 231 than the outer lateral part of the second source electrode 380 of the second power semiconductor device 232-2. The outer lateral part of the second source electrode 380 may be a side that is further away from the center region of the common drain pad 231 than the inner lateral part of the second source electrode 380.

The second short-lateral part 237b of the common gate pad 237 may be positioned between the first source electrode 340 of the first power semiconductor device 232-1 and the other side of the common drain pad 231. The second short-lateral part 237b of the common gate pad 237 may be positioned closer to the other side of the common drain pad 231 than the outer lateral part of the first source electrode 340 of the first power semiconductor device 232-1. The one side and the other side of the common drain pad 231 may be positioned opposite to each other. The outer lateral part of the first source electrode 340 may be a side that is further away from the center region of the common drain pad 231 than the inner lateral part of the first source electrode 340.

The size of the common gate pad 237 may be equal to or smaller than the size of the common source pad 239. By this arrangement structure, since the size of the common gate pad 237 is further expanded, bonding defect or debonding defect can be prevented, and a higher yield may be achieved.

For example, the common gate pad 237 may be disposed across the first source electrode 340 and the first gate electrode 330 of the first power semiconductor device 232-1 and the second gate electrode 370 and the second source electrode 380 of the second power semiconductor device 232-2 along one direction (the X-axis direction) on one side region of the common drain pad 231. For example, the common source pad 239 may be disposed across the first source electrode 340 of the first power semiconductor device 232-1 and the second source electrode 380 of the second power semiconductor device 232-2 along one direction (the X-axis direction) on the other side region of the common drain electrode 231. In the drawing, the common gate pad 237 is illustrated as vertically overlapping only a part of the first gate electrode 330 of the first power semiconductor device 232-1 and only a part of the second gate electrode 370 of the second power semiconductor device 232-2, but may also vertically overlap the entire region of the first gate electrode 330 and the entire region of the second gate electrode 370.

Figure 22:
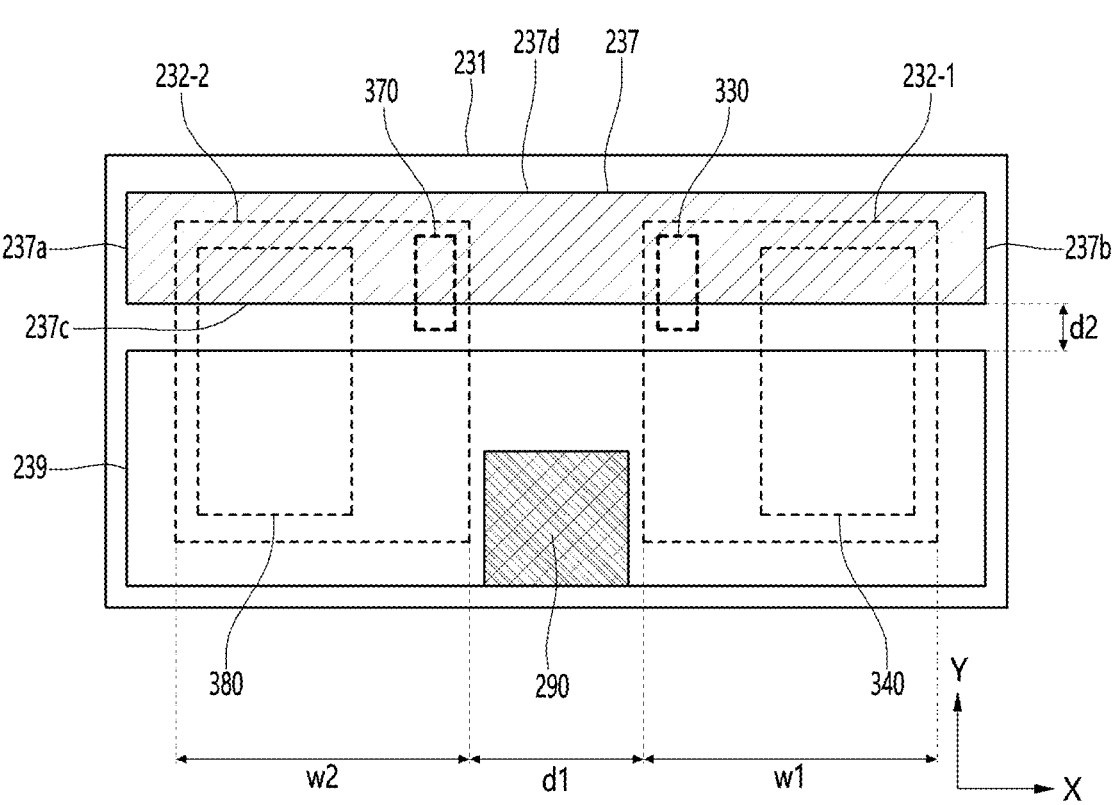
FIG. 22 is a ninth diagram illustrating the layout of a common gate pad and a common source pad according to the present disclosure.

Although not illustrated, the common source pad 239 may surround at least two outer parts of the common gate pad 237. FIG. 22 is a ninth exemplary drawing illustrating a layout of a common gate pad and a common source pad according to the present disclosure.

Except for the Kelvin source pad 290 in FIG. 22, it is the same as FIG. 21. Therefore, components having the same shape, structure, and/or function are given the same drawing reference numerals and detailed descriptions thereof will be omitted hereinafter. The Kelvin source pad 290 may also be applied to the arrangement structure of the common source pad 239 of the common gate pad 237 in FIG. 20.

Typically, a power converter 200 using power semiconductor modules comprising a first power semiconductor device 232-1 and a second power semiconductor device 232-2 used as a switch may be driven. For example, when the first power semiconductor device 232-1 and the second power semiconductor device 232-2 are turned on, the driving current increases rapidly, and an induced voltage may be generated by the parasitic capacitance on the source electrode. This induced voltage may flow into the gate electrode, causing a voltage drop. Accordingly, the voltage between the gate and the source may decrease, and the turn-on speed, i.e., the switching speed, may be slowed down. Similarly, the turn-off speed is be reduced in turn-off.

To address this issue, in the present disclosure, a Kelvin source pad 290 may be provided. The Kelvin source pad 290 may be a pad to which a Kelvin source (or driver), which supplies a voltage separate from the gate voltage supplied to the common gate pad 237, is to be connected. Accordingly, by supplying a voltage, which is separate from and different from the gate voltage, to the Kelvin source pad 290 via the Kelvin source, the above-described problem can be resolved.

In the case where the power converter 200 is implemented using power semiconductor devices, there was a problem that it was difficult to allocate a part of the source electrode to the Kelvin source pad 290 because the size of the power semiconductor device was very small.

However, in the aspect, as described above, the size of the common source pad 239 may be formed to be at least greater than the size of the first power semiconductor device 232-1 or the size of the second power semiconductor device 232-2. Accordingly, as illustrated in FIG. 22, a part of the common source pad 239 may be allocated to the Kelvin source pad 290. The Kelvin source pad 290 may be formed integrally with the common source pad 239 and may be designated as a region to be connected to the Kelvin source.

As illustrated in FIG. 21, since the size of the common source pad 239 is sufficiently wide, a part of the common source pad 239 disposed on a region between the first power semiconductor device 232-1 and the second power semiconductor device 232-2 may be designated as the Kelvin source pad 290. That is, since the size of the common source pad 239 is sufficiently wide, a sufficient size for connection to the Kelvin source may be allocated to the Kelvin source pad 290. Although the Kelvin source pad 290 is illustrated in the drawing as having a rectangular shape, various shapes are possible. Since the voltage from the Kelvin source is supplied to the Kelvin source pad 290, the generation of an induced voltage on the common source pad 239 can be suppressed, and a decrease in the switching speed can be prevented.

Meanwhile, in FIGS. 20 to 22, the first source electrode 340 and the second source electrode 380 are each illustrated as rectangular, but they may have other shapes, for example, shapes surrounding the first gate electrode 330 and the second gate electrode 370, respectively.

Figure 23:
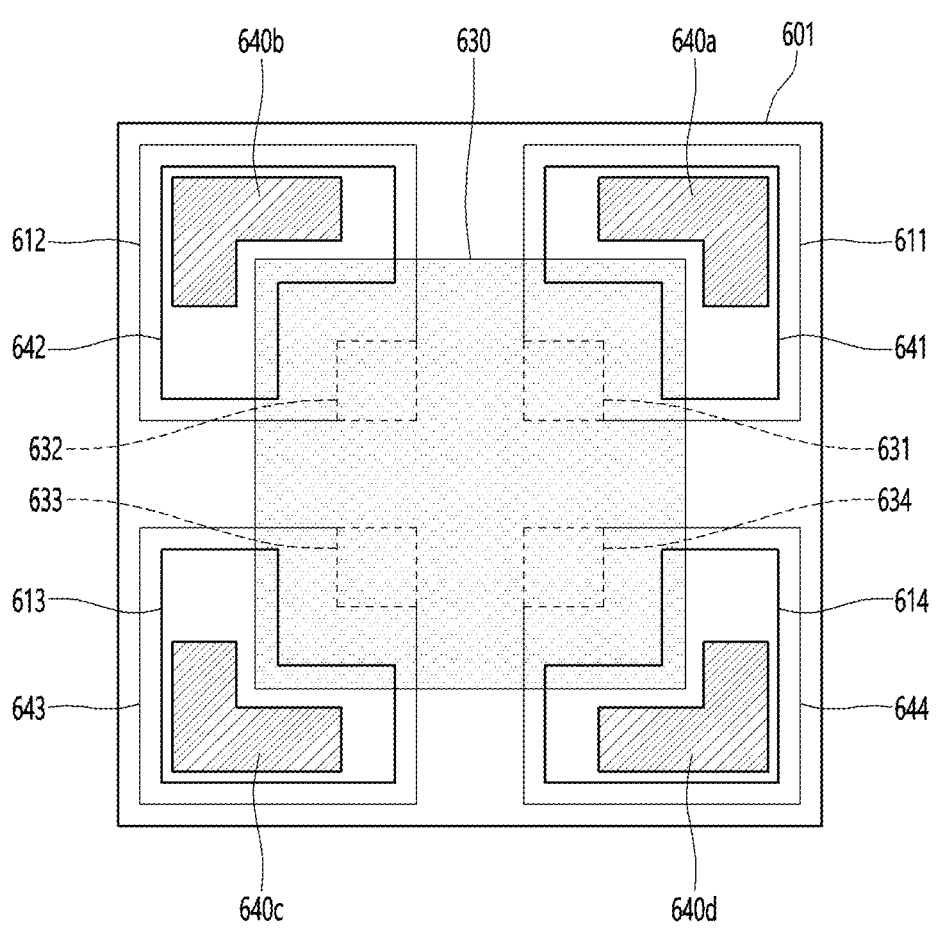
FIG. 23 is a tenth diagram illustrating the layout of a common gate pad and a common source pad according to the present disclosure.

FIG. 23 is a tenth diagram illustrating a layout of a power semiconductor module according to the present disclosure. The power semiconductor module of the aspect illustrated in FIG. 23 may adopt the technical features of the power semiconductor module based on FIGS. 20 to 22 described above, and hereinafter, a description will be given mainly with reference to the technical features of the power semiconductor module illustrated in FIG. 23. The power semiconductor module 600A of the aspect illustrated in FIG. 23 is an example in which four power semiconductor devices 611 to 614 are disposed on a common drain pad 601 to form one module, and a common gate pad 630 is disposed on the four power semiconductor devices 611 to 614.

For example, the first to fourth power semiconductor devices 611 to 614 may comprise first to fourth source electrodes 641 to 644, respectively, and first to fourth gate electrodes 631 to 634, respectively.

In the power semiconductor module 600A, the first to fourth power semiconductor devices 611 to 614 may comprise first to fourth source pads 640a to 640d disposed on the first to fourth source electrodes 641 to 644, respectively.

In addition, the power semiconductor module 600A may comprise a common gate pad 630 disposed on the first to fourth gate electrodes 631 to 634 of the first to fourth power semiconductor devices 611 to 614.

Figure 24:
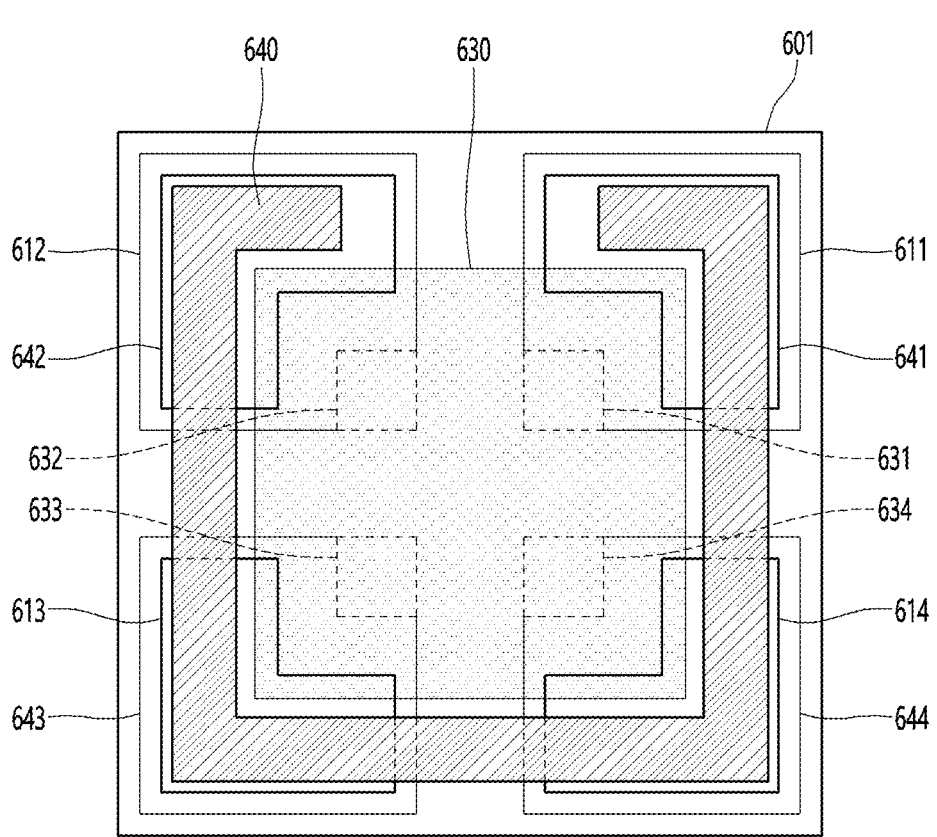
FIG. 24 is an eleventh diagram illustrating a layout of a common gate pad and a common source pad according to the present disclosure.

FIG. 24 is an eleventh diagram illustrating a layout of a power semiconductor module according to the present disclosure. The power semiconductor module of the aspect illustrated in FIG. 24 may adopt the technical features of the power semiconductor module based on FIGS. 20 to 23 described above, and hereinafter, a description will be given mainly with reference to the technical features of the power semiconductor module illustrated in FIG. 24.

The power semiconductor module 600B of the aspect illustrated in FIG. 24 is an example in which a common gate pad 630 and a common source pad 640 are disposed on four power semiconductor devices.

For example, the power semiconductor module of the aspect illustrated in FIG. 23 is an example in which four power semiconductor devices 611 to 614 are disposed on a common drain pad 601 to form one module, and a common gate pad 630 and a common source pad 640 are disposed on the four power semiconductor devices 611 to 614.

For example, the power semiconductor module 600B may comprise a common source pad 640 disposed on the first to fourth source electrodes 641 to 644 of the first to fourth power semiconductor devices 611 to 614 and a common gate pad 630 disposed on the first to fourth gate electrodes 631 to 634 of the first to fourth power semiconductor devices 611 to 614.

Meanwhile, FIG. 24 illustrates that the common gate pad 630 is disposed on the inside and the common source pad 640 is disposed on the outside, but is not limited thereto. For example, in the additional present disclosure, the common gate pad 630 may be disposed on the outside and the common source pad 640 may be disposed on the inside.

Specifically, in the power semiconductor module 600B of the aspect, the first to fourth gate electrodes 631 to 634 of the first to fourth power semiconductor devices 611 to 614 may be disposed to be positioned at outer edges, respectively, and the first to fourth source electrodes 641 to 644 may be disposed to be positioned on the inner lateral part, respectively.

Thereafter, a common gate pad 630 may be disposed on the first to fourth gate electrodes 631 to 634, respectively, which are disposed at outer edges, and a common source pad 640 may be disposed on the first to fourth source electrodes 641 to 644, which are positioned on the inner lateral part.

Hereinafter, a manufacturing process of a power semiconductor module according to the present disclosure will be described with reference to FIGS. 25A to 25H. Meanwhile, the manufacturing process of the power semiconductor module according to the present disclosure is not limited to the process sequence or the process contents described in FIGS. 25A to 25H, and the process sequence may be changed, some processes may be omitted, or other processes may be added.

Figure 25A:
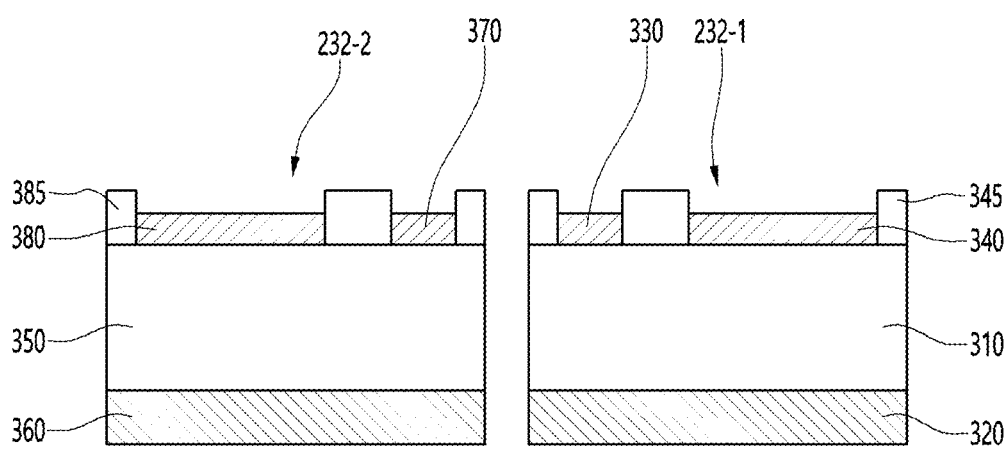
FIGS. 25A to 25H illustrate a manufacturing process of a power semiconductor module according to the present disclosure.

First, as illustrated in FIG. 25A, a plurality of power semiconductor devices, for example, a first power semiconductor device 232-1 and a second power semiconductor device 232-2, may be provided. The first power semiconductor device 232-1 may comprise a first drain electrode 320, a first semiconductor layer 310, a first gate electrode 330, and a first source electrode 340. The second power semiconductor device 232-2 may comprise a second drain electrode 360, a second semiconductor layer 350, a second gate electrode 370, and a second source electrode 380.

In the first power semiconductor device 232-1, a first insulating layer 345 may be disposed around each of the first gate electrode 330 and the second source electrode 380, so that an electrical short-circuit between the first gate electrode 330 and the first source electrode 340 can be prevented, and the first semiconductor layer 310 may be protected from heat, moisture, impact, etc. In the second power semiconductor device 232-2, a second insulating layer 385 may be disposed around each of the second gate electrode 370 and the second source electrode 380, so that an electrical short-circuit between the second gate electrode 370 and the second source electrode 380 can be prevented, and the second semiconductor layer 350 may be protected from heat, moisture, impact, etc. The first insulating layer 345 and/or the second insulating layer 385 may be formed of an inorganic insulating material, but is not limited thereto.

Figure 25B:
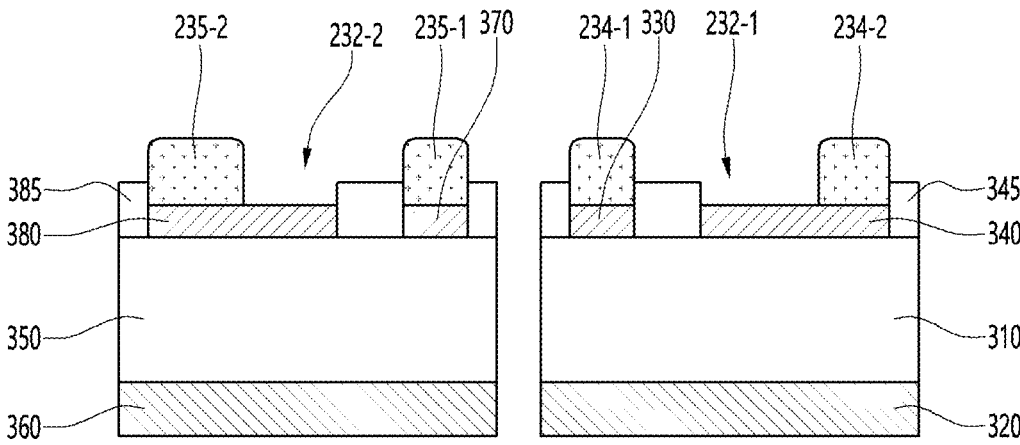

As illustrated in FIG. 25B, a sputtering and/electroplating process may be performed using the first insulating layer 345 as a mask, so that a first gate contact 234-1 and a first source contact 234-2 may be formed on the first gate electrode 330 and the first source electrode 340 of the first power semiconductor device 232-1, respectively. A sputtering and/electroplating process may be performed using the second insulating layer 385 as a mask, so that a second gate contact 235-1 and a third source contact may be formed on the second gate electrode 370 and the second source electrode 380 of the second power semiconductor device 232-2, respectively. Here, the contact may be named a stud, a pillar, etc.

Figure 25C:
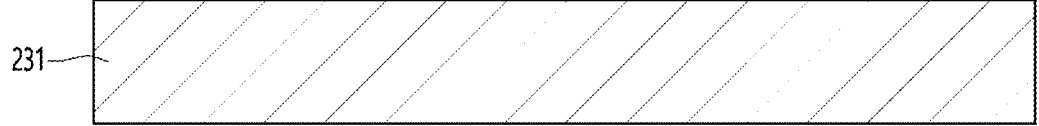
Figure 25D:
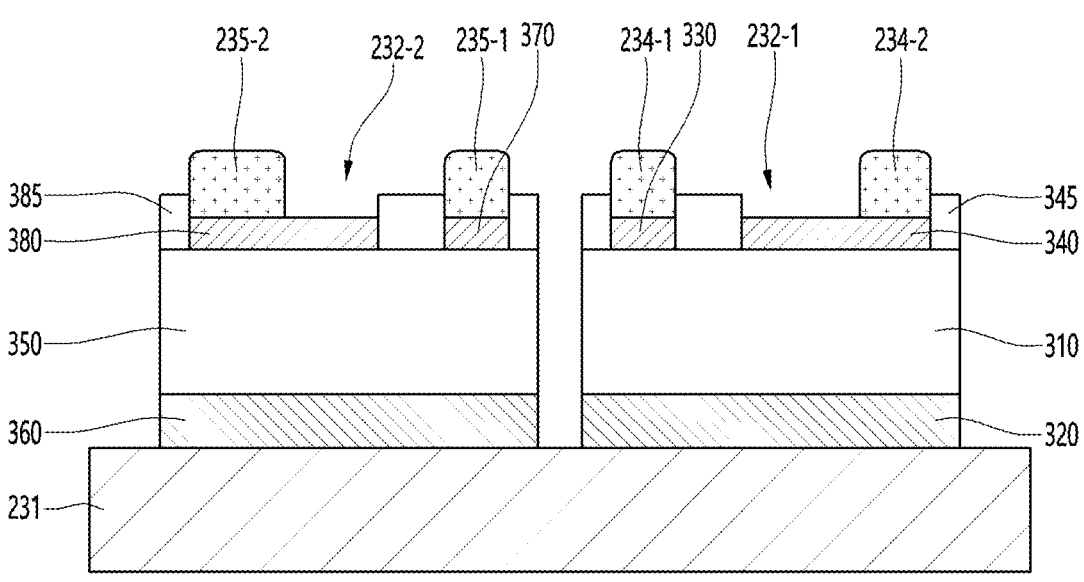
Figure 25E:
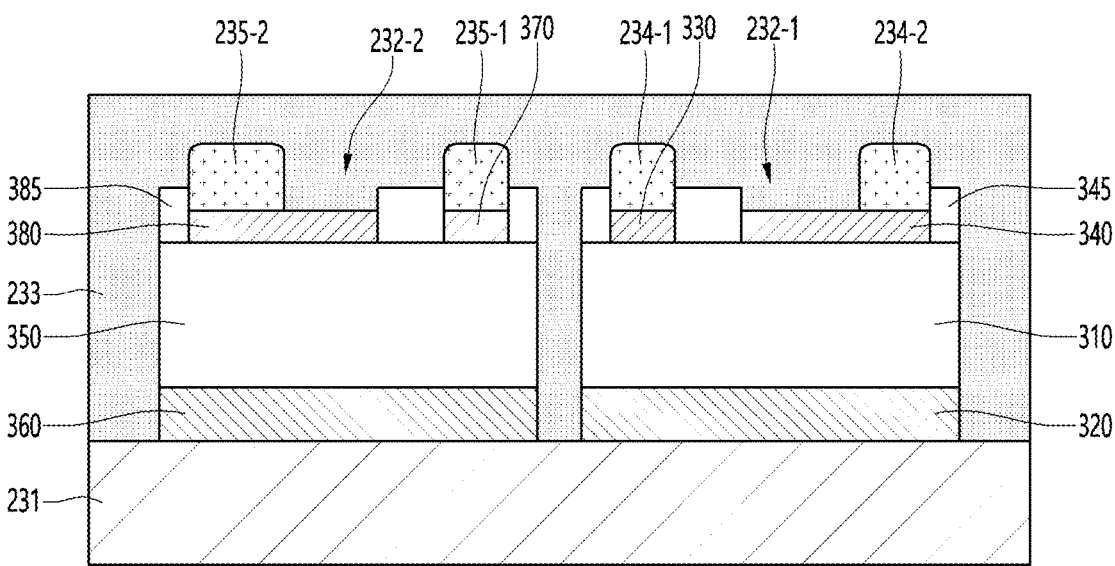

Meanwhile, unlike as illustrated in FIG. 25B, the process of forming the first gate contact 234-1 and the first source contact 234-2 on the first power semiconductor device 232-1, and the process of forming the first gate contact 235-1 and the first source contact 235-2 on the second power semiconductor device 232-2 may be formed after the process of forming the molding layer 233 by the over-molding process as illustrated in FIG. 25E.

The processes as illustrated in FIG. 25A and FIG. 25B may be performed at the wafer level. That is, after the drain electrodes 320 and 360, the semiconductor layers 310 and 350, the insulating layers 345 and 385, a plurality of gate electrodes 330 and 370, a plurality of source electrodes 340 and 380, a plurality of gate contacts 234-1 and 235-1, and a plurality of source contacts 234-2 and 235-2 are formed on a wafer (not illustrated), a cutting process may be performed. Accordingly, a first power semiconductor device 232-1 and a second power semiconductor device 232-2 may be formed from the wafer. The wafer may be removed before or after performing the cutting process.

As illustrated in FIG. 25C, a common drain pad 231 may be provided. The common drain pad 231 may be formed of a metal material having excellent electrical conductivity. For example, the common drain pad 231 may have a three-layer structure of copper (Cu)-molybdenum (Mo)-copper (Cu).

As illustrated in FIG. 25D, the first power semiconductor device 232-1 and the second power semiconductor device 232-2 may be bonded on the common drain pad 231. For example, the first power semiconductor device 232-1 and the second power semiconductor device 232-2 may be bonded on the common drain pad 231 using a sintering process. A bonding agent such as Ag paste may be used for a given process, but is not limited thereto.

Figure 25F:
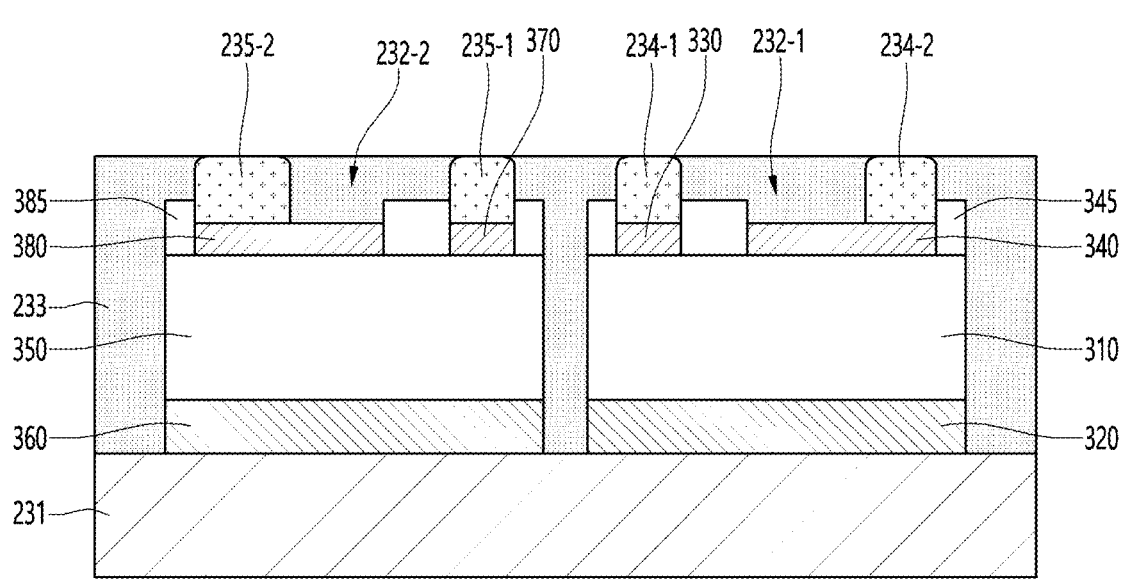

As illustrated in FIG. 25E, a molding layer 233 may be formed on the first power semiconductor device 232-1 and the second power semiconductor device 232-2 using an EMC molding process. Thereafter, as illustrated in FIG. 25F, the molding layer 233 on the first power semiconductor device 232-1 and the second power semiconductor device 232-2 may be removed using an EMC grinding process. Accordingly, the upper surface of the molding layer 233 and the upper surfaces of the first gate contact 234-1, the first source contact 234-2, the second gate contact 235-1, and the second source contact 235-2 may be positioned on the same horizontal line.

Meanwhile, as described above, unlike that illustrated in FIG. 25E, the process of forming the first gate contact 234-1 and the first source contact 234-2 on the first power semiconductor device 232-1 and the process of forming the first gate contact 235-1 and the first source contact 235-2 on the second power semiconductor device 232-2 may be performed after the process of forming the molding layer 233 by the over-molding process illustrated in FIG. 25E.

Figure 25G:
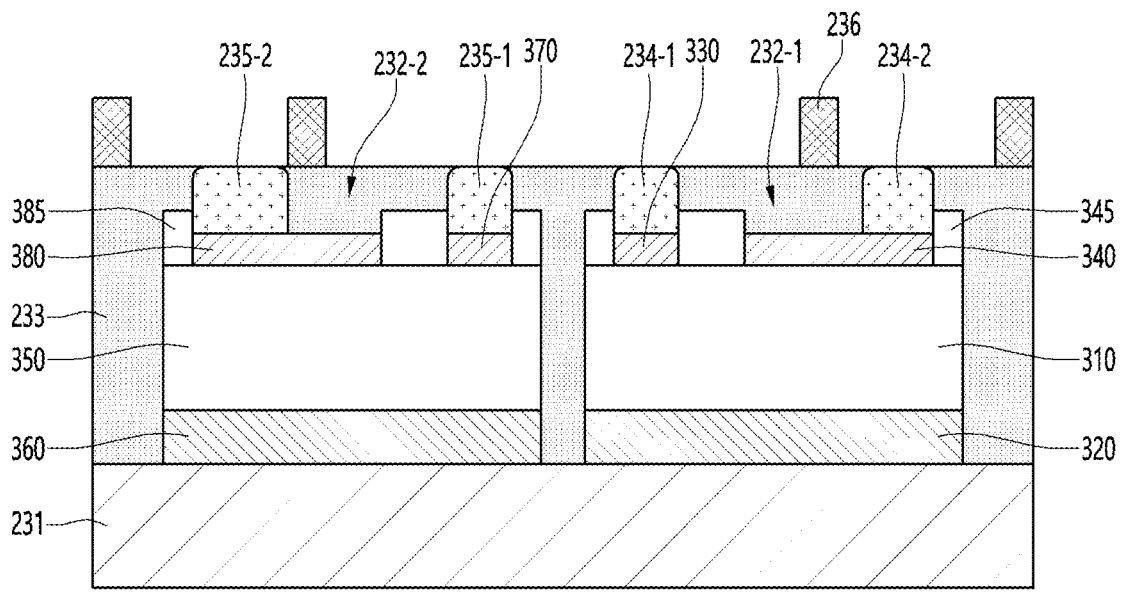
Figure 25H:
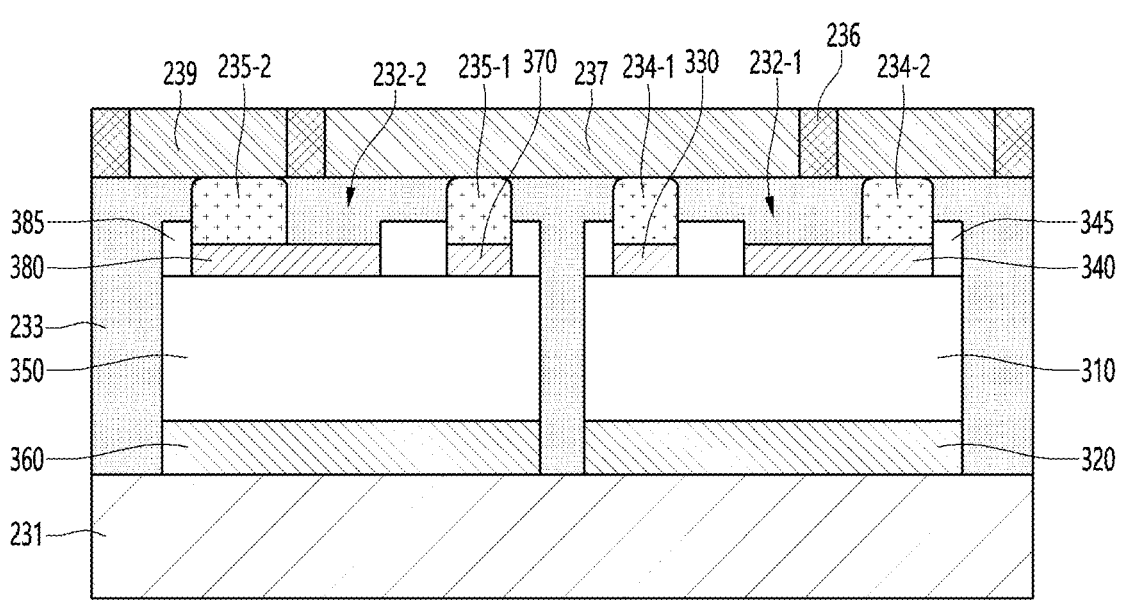

For example, the over-molded molding layer 233 may be ground to expose the first gate electrode 330 and the first source electrode 340 of the first power semiconductor device 232-1 and the second gate electrode 370 and the second source electrode 380 of the second power semiconductor device 232-2.

as illustrated in FIG. 25H, a process of forming a first gate contact 234-1 and a first source contact 234-2 on the first power semiconductor device 232-1, a process of forming a first gate contact 235-1 and a first source contact 235-2 on the second power semiconductor device 232-2, and a process of forming a common gate pad 237 and a common source pad 239 may be performed thereafter.

As illustrated in FIGS. 25G and 25H, an insulating layer 236, a common gate pad 237, and a common source pad 239 may be formed. An insulating layer 236 may be formed such that the common gate pad 237 vertically overlaps the first gate electrode 330 and the first source electrode 340 of the first power semiconductor device 232-1 and the second gate electrode 370 and the second source electrode 380 of the second power semiconductor device 232-2, respectively.

Thereafter, a sputtering and/or electroplating process may be performed using the insulating layer 236 as a mask to form the common gate pad 237 and the common source pad

239. The insulating layer 236 may be formed on the remaining region except for a region where the common gate pad 237 and the common source pad 239 are to be formed. The common gate pad 237 and the common source pad 239 may be surrounded by the insulating layer 236. As described above, the size of each of the common gate pad 237 and the common source pad 239 may be expanded. The size of each of the common gate pad 237 and the common source pad 239 can be freely adjusted by the layout of the insulating layer 236.

Meanwhile, the insulating layer 236 may protect the first power semiconductor device 232-1 and the second power semiconductor device 232-2 from heat, moisture, etc., and thus may be named a passivation layer. The insulating layer 236 may be formed of an inorganic insulating material, but is not limited thereto.

The above detailed description should not be construed as restrictive in all respects and should be considered as illustrative. The scope of the aspects should be determined by a reasonable interpretation of the appended claims, and all changes within the equivalent scope of the aspects are included in the scope of the aspects.

The invention claimed is:

1. A power semiconductor module, comprising: a common drain pad; a first power semiconductor device on a first region of the common drain pad; a second power semiconductor device on a second region of the common drain pad; a common gate pad on the first power semiconductor device and the second power semiconductor device; and a source pad on the first power semiconductor device and the second power semiconductor device, wherein the common drain pad is configured to be electrically connected to a first drain electrode of the first power semiconductor device and a second drain electrode of the second power semiconductor device, wherein the common gate pad is configured to be electrically connected to a first gate electrode of the first power semiconductor device and a second gate electrode of the second power semiconductor device, wherein the source pad is configured to be electrically connected to a first source electrode of the first power semiconductor device and a second source electrode of the second power semiconductor device, and wherein the source pad is configured to surround at least two outer lateral parts of the common gate pad, wherein the source pad comprises a common source pad that vertically overlaps the first power semiconductor device and the second power semiconductor device.

2. The power semiconductor module of claim 1, wherein the common source pad has an opening, and the common gate pad is positioned in the opening.

3. The power semiconductor module of claim 1, wherein the common gate pad comprises a first short-lateral part and a second short-lateral part in one direction, and a first long-lateral part and a second long-lateral part in a direction perpendicular to the one direction.

4. The power semiconductor module of claim 3, wherein the common source pad is positioned on the first short-lateral part, the second short-lateral part, and the first long-lateral part of the common gate pad.

5. The power semiconductor module of claim 4, wherein the common source pad is positioned on the second long-lateral part of the common gate pad.

6. The power semiconductor module of claim 3, wherein the first short-lateral part of the common gate pad is positioned between the first gate electrode and the first source electrode, and wherein the second short-lateral part of the common gate pad is positioned between the second gate electrode and the second source electrode.

7. The power semiconductor module of claim 1, wherein the source pad comprises a first source pad and a second source pad that vertically overlap the first source electrode of the first power semiconductor device and the second source electrode of the second power semiconductor device, respectively.

8. The power semiconductor module of claim 1, further comprising:
a Kelvin source pad spaced apart from the source pad on the first power semiconductor device and the second power semiconductor device.

9. The power semiconductor module of claim 1, wherein a size of the common gate pad is greater than a size of the first gate electrode of the first power semiconductor device or a size of the second gate electrode of the second power semiconductor device.

10. A power semiconductor module, comprising: a common drain pad; a first power semiconductor device on a first region of the common drain pad; a second power semiconductor device on a second region of the common drain pad; a common gate pad on the first power semiconductor device and the second power semiconductor device; and a source pad on the first power semiconductor device and the second power semiconductor device, wherein the common drain pad is configured to be electrically connected to a first drain electrode of the first power semiconductor device and a second drain electrode of the second power semiconductor device, wherein the common gate pad is configured to be electrically connected to a first gate electrode of the first power semiconductor device and a second gate electrode of the second power semiconductor device, wherein the source pad is configured to be electrically connected to a first source electrode of the first power semiconductor device and a second source electrode of the second power semiconductor device, and wherein the common gate pad vertically overlaps at least one of the first source electrode and the second source electrode, wherein the source pad comprises a common source pad that vertically overlaps the first power semiconductor device and the second power semiconductor device.

11. The power semiconductor module of claim 10, wherein the source pad comprises a first source pad and a second source pad that vertically overlap the first source electrode of the first power semiconductor device and the second source electrode of the second power semiconductor device, respectively.

12. The power semiconductor module of claim 10, wherein the common gate pad is disposed across the first source electrode and the first gate electrode and the second gate electrode and the second source electrode along one direction on the first region of the common drain pad.

13. The power semiconductor module of claim 10, wherein the common source pad is disposed across the first source electrode and the second source electrode along one direction on the second region of the common drain pad.

14. The power semiconductor module of claim 10, wherein an area of the common source pad is greater than an area of the first source electrode of the first power semiconductor device or an area of the second source electrode of the second power semiconductor device.

15. The power semiconductor module of claim 10, wherein an area of the common drain pad is greater than a sum of an area of the common gate pad and an area of the common source pad.

16. The power semiconductor module of claim 10, further comprising:
a Kelvin source pad spaced from the source pad on the first power semiconductor device and the second power semiconductor device.

17. A power converter, comprising:
a first substrate;
a second substrate; and
a plurality of power semiconductor modules between the first substrate and the second substrate,
wherein the plurality of power semiconductor modules each comprise:
a common drain pad;
a first power semiconductor device on a first region of the common drain pad;
a second power semiconductor device on a second region of the common drain pad;
a common gate pad on the first power semiconductor device and the second power semiconductor device; and
a common source pad on the first power semiconductor device and the second power semiconductor device,
wherein the common source pad is configured to surround at least two lateral parts of the common gate pad,
wherein in some modules of the plurality of power semiconductor modules, the common drain pad is configured to be electrically connected to the first substrate, the common gate pad and the common source pad are each electrically connected to the second substrate, and
wherein in the remaining modules of the plurality of power semiconductor modules, the common drain pad is configured to be electrically connected to the second substrate, and the common gate pad and the common source pad are each electrically connected to the first substrate.

18. The power converter of claim 17, further comprising:
a plurality of terminals connected to each of the first substrate and the second substrate.

* * * * *